(12) United States Patent
Blank et al.

(10) Patent No.: US 7,403,008 B2
(45) Date of Patent: Jul. 22, 2008

(54) ELECTRON SPIN RESONANCE MICROSCOPE FOR IMAGING WITH MICRON RESOLUTION

(75) Inventors: Aharon Blank, Ithaca, NY (US); Curt R. Dunnam, Trumansburg, NY (US); Peter P. Borbat, Ithaca, NY (US); Jack H. Freed, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 11/195,388

(22) Filed: Aug. 2, 2005

(65) Prior Publication Data

US 2006/0022675 A1 Feb. 2, 2006

Related U.S. Application Data

(60) Provisional application No. 60/598,100, filed on Aug. 2, 2004.

(51) Int. Cl.
*G01V 3/00* (2006.01)
(52) U.S. Cl. .................................................. 324/316
(58) Field of Classification Search .......... 324/300–322
See application file for complete search history.

(56) References Cited

U.S. PATENT DOCUMENTS

| | | | |
|---|---|---|---|
| 4,922,180 A * | 5/1990 | Saffer et al. ................. | 324/639 |
| 5,233,303 A * | 8/1993 | Bales et al. .................. | 324/316 |
| 5,397,988 A * | 3/1995 | Schmalbein et al. ........ | 324/316 |
| 5,433,196 A | 7/1995 | Fiat | |
| 5,502,386 A | 3/1996 | Bourg et al. | |
| 5,512,829 A * | 4/1996 | Holczer et al. .............. | 324/316 |
| 5,530,355 A | 6/1996 | Doty | |
| 5,678,548 A | 10/1997 | Murugesan et al. | |
| 5,789,257 A * | 8/1998 | Tapper et al. ................ | 436/173 |

(Continued)

FOREIGN PATENT DOCUMENTS

WO    WO 01/33244    5/2001

(Continued)

OTHER PUBLICATIONS

T.A. Carpenter et al., "Magnetic Resonance Microscopy"; IEE, 1994 pp. 1-2.*

(Continued)

*Primary Examiner*—Brij B. Shrivastav
*Assistant Examiner*—Dixomara Vargas
(74) *Attorney, Agent, or Firm*—Marjama Muldoon Blasiak & Sullivan LLP

(57) ABSTRACT

ESR microscope systems and methods for examining specimens using both continuous wave and pulsed modes in the 9 to 60 GHz range. The ESR microscope uses an image probe comprising gradient coils in addition to conventional modulation coils (in continuous wave mode) or magnetic field bias coils (in pulse mode), and a resonator constructed from high permittivity material. The systems and methods also involves the use of sample containers that permit the precise placement of samples in relation to the image probe. The microscope uses a microstrip or thin coaxial or dielectric antenna to obtain a high coupling coefficient to the specimen being imaged. The microscope systems provide resolution at the single micron level, and permit the observation of images comprising tens to hundreds of pixels for each of two or three dimensions in a few minutes. Novel stable radicals used as the imaging media are also described.

40 Claims, 11 Drawing Sheets

U.S. PATENT DOCUMENTS

| | | | |
|---|---|---|---|
| 5,865,746 A | | 2/1999 | Murugesan et al. |
| 5,889,402 A | * | 3/1999 | Kumatoriya et al. ........ 324/321 |
| 6,346,813 B1 | * | 2/2002 | Kleinberg ................... 324/303 |
| 6,828,789 B2 | * | 12/2004 | Hyde et al. ................. 324/316 |
| 7,109,706 B2 | * | 9/2006 | Xiang et al. ................ 324/300 |
| 7,292,035 B2 | * | 11/2007 | Habara et al. .............. 324/316 |
| 2005/0118102 A1 | * | 6/2005 | Xiang et al. ............... 424/9.34 |

OTHER PUBLICATIONS

Blank A et al.: "High resolution electron spin resonance microscopy" *Journal of Magnetic Resonance, Academic Press,* Orlando, FL US, vol. 165, No. 1, Nov. 2003, pp. 116-127, XP004466389 ISSN: 1090-7807 abstract p. 116, col. 1,2-p. 125, col. 1, 2.

Quine R. W. et al.: "Pulsed EPR Spectrometer" *Review of Scientific Instruments,* AIP, Melville, NY, US vol. 58, No. 9, Sep. 1, 1987 pp. 1709-1723, XP000605540 ISSN: 0034-6748; p. 1709-p. 1721.

* cited by examiner

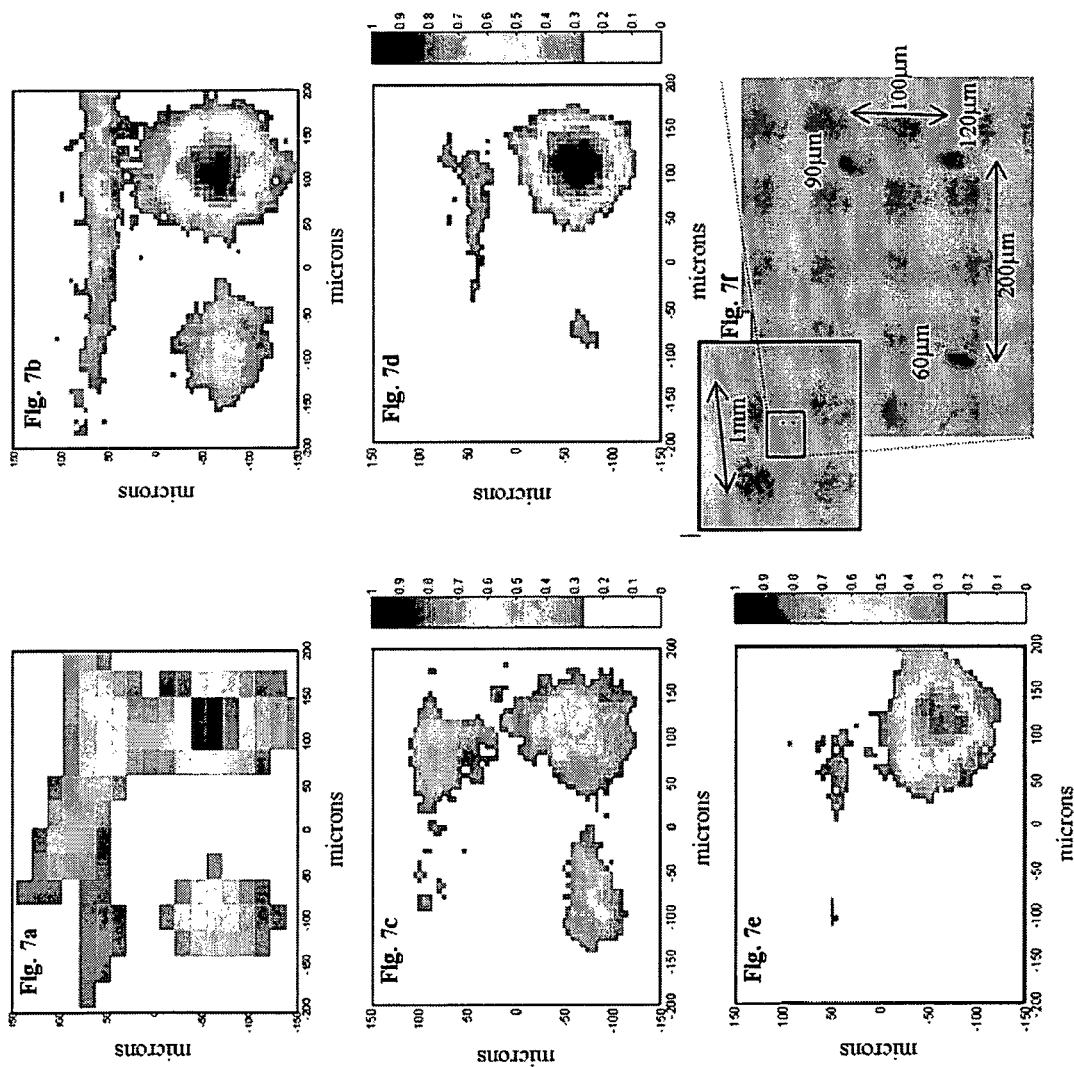

ELECTRON SPIN RESONANCE MICROSCOPE FOR IMAGING WITH MICRON RESOLUTION

CROSS-REFERENCE TO RELATED APPLICATIONS

This application claims priority to and the benefit of co-pending U.S. provisional patent application Ser. No. 60/598,100, filed Aug. 2, 2004, which application is incorporated herein by reference in its entirety.

STATEMENT REGARDING FEDERALLY SPONSORED RESEARCH OR DEVELOPMENT

This invention was made with Government support from the National Science Foundation (NSF) under Grant No. CHE0098022. The Government has certain rights in the invention.

FIELD OF THE INVENTION

The invention relates to magnetic resonance imaging in general and particularly to high resolution electron spin resonance (ESR) imaging.

BACKGROUND OF THE INVENTION

Many fields of science and medicine require the close observation of small samples, for example, thin tissue slices extracted from living organisms or living/fixed cell cultures. Currently, the leading modalities for these kinds of observations are optical and fluorescence microscopy. These techniques are very mature and provide rich information regarding the investigated sample. Nevertheless, such optical-based modalities lack the ability to observe moderately thick three-dimensional (3D) non-transparent samples. They can not measure vital parameters such as molecular self diffusion and 3D flow vectors, and, for example in terms of medical tissues, many times result in inconclusive clinical diagnosis of histological samples. Furthermore, using optical methods, the following difficulties are encountered: it is difficult to image accurately the $O_2$ partial pressure in specimens; it is difficult to recognize with high specificity various superoxides in the imaged sample; one can not measure a variety of image contrasts such as the spatially-resolved magnetic resonance relaxation times ($T_1$ and $T_2$) and the lineshape of the spins in the sample; and optical methods lack the possibility to correlate in-vitro with in-vivo measurements.

Nuclear Magnetic Resonance (NMR) microscopy, in which the nuclear spins can be considered as a unique kind of magnetic stain or dye, is currently a relatively widespread complimentary imaging tool for small samples that is found useful in many diverse clinical situations to achieve high identification specificity and measurement accuracy in cases of inflammation, fluid diffusion, blood flow and perfusion, lipid content, tissue types such as cancer, and tissue necrosis. NMR microscopy has also been found useful in materials science and botany to investigate and measure flow and porosity. Several NMR devices and applications of NMR microscopy are described in U.S. Pat. Nos. 5,258,710, 5,394,088, and 5,416,414. Thus, NMR microscopes are routinely employed in many fields of science and medicine, and several companies are producing such instruments commercially. Some people have even combined NMR and optical microscopes. The main drawback of the existing NMR microscopes is their high price (in the range of $500,000 to $1,500,000, mainly due to the superconducting magnet technology required for their operation), and the limited image resolution they offer (>10 microns), which can not rival the <0.5 micron resolution of optical imaging modalities. Due to these limitations (and regardless of the many potential advantages), the full potential of magnetic resonance microscopy cannot be readily exploited and such instruments are presently much less abundant than the optical-based microscopes in scientific and medical laboratories around the world.

Another, less common technique of magnetic resonance imaging, employs electron spin resonance (ESR) in paramagnetic molecules, rather than the spins of hydrogen nuclei. Whereas the field of NMR microscopy is well developed, ESR microscopy is not. Nevertheless, ESR has inherently many potential virtues over NMR, which could make this a technique of choice for Magnetic Resonance (MR) microscopic applications. For example, the signal per spin is much higher than in NMR, diffusion does not limit the resolution in the short time scales ($T_2$'s~μs) of the ESR measurements, ESR micro-resonators detect with a quality factor (Q) of ~1000 compared to the Q~10 of the NMR micro-coils, and the ESR lineshape is more sensitive to dynamic effects, leading to richer information. An additional factor is the low cost of electromagnets used in ESR as compared to the expensive superconducting magnets of NMR microscopes. Since most samples do not contain stable paramagnetic molecules, paramagnetic species (often in the form of stable organic radicals) must be added in a manner similar to that of adding contrast agents in NMR or dyes in optics. This is a standard procedure, especially for microscopy, which also offers the benefit of eliminating any concerns associated with a large undesirable background signal, (such as protons in NMR). An ESR microscope can provide similar spatially resolved sample parameters to those obtained by NMR measurements, (i.e. spin concentration, relaxation times $T_1$, $T_2$, and diffusion coefficient), which compliments the information obtained by conventional optical microscopy.

Up to now, most ESR imaging (ESRI) efforts in biological samples have been directed towards observation of large subjects and to determining the radical and oxygen concentration (by its effect on the radical line width). U.S. Pat. Nos. 5,502,386, 5,578,922, 5,678,548 and 5,865,746 describe some of these efforts. Such experiments, conducted in-vivo, employ low fields of ~10 mT at low RF frequencies (which results in relatively low spin sensitivity), so that the RF energy will penetrate deeply into the relatively large biological object. Consequently, a typical voxel resolution in low frequency ESR experiments is ca. $[2\text{ mm}]^3$. Most low-field ESR imaging techniques are based on Continuous Wave (CW) detection where the image is obtained by applying static gradients in various directions with respect to the object, which is sometimes referred to as the back projection technique. However, utilization of a single pulse Free Induction Decay (FID) sequence in conjunction with pulsed and static gradients has been also explored.

Previous publications, including a paper from one the inventors, have described in the past an ESR resonator based on high permittivity $KTaO_3$ and demonstrated its application in the field of ESR spectroscopy. Such high permittivity small resonator structures, however, were not employed in the past as a basis for a miniature ESR imaging probe (which includes a resonator and the imaging gradient coils).

Other emerging techniques of high resolution ESR imaging include the use of magnetic tips (Magnetic Resonance Force Microscopy), Hall detection, scanning-tunneling microscopy (STM-ESR), and miniature microwave scanning probe. Nevertheless all these methods can be employed only to a very limited extent when botanically and biologically-related or relatively thick samples are considered. Thus, for example, the detection by magnetic tips as described in U.S. Pat. No. 6,683,451 suffers from low 3D sensitivity, especially when the samples are thicker than a few microns. Furthermore, this technique requires extreme physical conditions (high vacuum and often low temperatures), and can be employed only after complicated sample preparation. The STM-ESR is a surface (two-dimensional, or 2D) technique capable of handling only solid state samples placed over a conductive surface and also required extreme physical conditions for successful operation. The Hall detection and the miniature microwave scanning probe methods also operates only on the surface, or slightly below it, and have not proven to be useful in micron resolution imaging.

A number of problems in nuclear magnetic resonance imaging have been observed, including the need for strong magnetic fields, requiring expensive superconducting magnets, and the limited spatial resolution of images that are obtained.

There is a need for magnetic resonance imaging systems and methods that provide high resolution 2D and 3D images, especially for thin and thick biologically-related samples, at modest cost, and in short (1-10 min) acquisition times.

SUMMARY OF THE INVENTION

The present invention is an ESR-based microscope, which may be employed to obtain micron resolution images of biological- and materials science-related samples. Conceptually, it combines the fields of NMR microcopy with the field of large scale in-vivo ESR. One novel element of the invention lies in the use of specially designed miniature microwave resonators along with integral miniature magnetic field gradient coils, which facilitate the combination of high sensitivity and high spatial resolution. The miniature gradient coils set are placed very close to the resonator without affecting its microwave performance. Other novel aspects are related to the use of fast pulsed field gradient, unique sample containers, the use of special stable free radical material as an imaging contrast medium, and the system architecture.

A publication, published by the inventors less than a year before the submission of co-pending U.S. provisional patent application Ser. No. 60/598,100 of which priority is claimed, describes the general theory of ESR microcopy, both for CW and pulse operation, in terms of image signal-to-noise-ratio (SNR) and image resolution. It also provides an example of a 2D CW ESR imaging probe, with some measured results.

In one aspect, the invention relates to a electron spin resonance instrument for obtaining electron spin resonance images of a specimen. The electron spin resonance images have a resolution of at least 10×10×30 microns. The images are acquired in a time period of less than 10 minutes.

In one embodiment, the electron spin resonance image has a resolution of 5×5×10 microns. In one embodiment, the electron spin resonance image has a resolution of 3×3×8 microns. In one embodiment, the electron spin resonance image has a resolution of 1×1×5 microns. In one embodiment, the electron spin resonance image has an electron spin sensitivity of $10^6$ spins per voxel for 60 min acquisition at room temperature. In one embodiment, the electron spin resonance image has an electron spin sensitivity of $10^5$ spins per voxel for 60 min acquisition at room temperature.

In one embodiment, the electron spin resonance instrument is configured to operate using continuous-wave electron spin resonance (CW ESR). In one embodiment, the electron spin resonance instrument of comprises (a) a conventional CW ESR spectrometer; (b) an imaging probe comprising a microwave resonator, and one or more gradient coils in electrical communication with the CW ESR spectrometer; (c) a signal conditioner for receiving, amplifying and conditioning the signal from the ESR spectrometer and provides an amplified and conditioned signal as output; (d) a computer which controls an imaging process and processes the conditioned output signal; and (e) at least one current driver for the gradient coils, the at least one current driver being controlled during the imaging process and driving at least one of the gradient coils. In one embodiment, the signal conditioner is a filter and a base band amplifier. In one embodiment, the baseband amplifier operates up to a frequency of 250 kHz.

In one embodiment, the electron spin resonance instrument further comprises a mechanical fixture for holding a sample. In one embodiment, the electron spin resonance instrument further comprises (f) a control unit.

In one embodiment, the magnetic resonance instrument is configured to operate using pulsed electron spin resonance. In one embodiment, the electron spin resonance instrument comprises (a) a computer which controls the overall image acquisition process through a user interface; (b) a timing system; (c) a digitizer; (d) an analog output device; (e) a microwave reference source; (f) a low power pulsed microwave bridge; (g) a low power microwave transceiver; (h) a solid-state power amplifier; (j) at least one pair of gradient coil drivers; (i) a pre-regulated high voltage power supply; (k) an imaging probe; (l) a high voltage tracking power supply; and (m) a monitor scope.

In one embodiment, the computer is a personal computer. In one embodiment, the user interface is a graphical user interface. In one embodiment, the timing system comprises a plurality of TTL outputs, time resolution of less than or equal to 10 ns, programming time of 10 μs or less, and minimal pulse length of less than or equal to 50 ns. In one embodiment, the timing system comprises at least four analog outputs and an update rate of at least 200 kHz. In one embodiment, the microwave reference source comprises a power output of approximately 10 dBm at the 2-18 GHz range. In one embodiment, the low power microwave transceiver operates in the 6-17 GHz range. In one embodiment, the low power microwave transceiver is a homodyne transceiver that comprises one transmission channel with bi-phase modulation, which controls the individual pulse phase. In one embodiment, the individual pulse phase is a selected one of 0°, 90°, 180°, and 270°.

In another aspect, the invention features a miniature imaging probe for an electron spin resonance imaging apparatus, comprising a microwave resonator and at least one gradient coil.

In one embodiment, the microwave resonator comprises high permittivity material. In one embodiment, the high permittivity material has a non-conducting dielectric ring structure. In one embodiment, the microwave resonator is configured to permit gas flow for temperature stabilization of the microwave resonator. In one embodiment, the miniature imaging probe for an electron spin resonance imaging apparatus further comprises a microstrip to obtain a high coupling coefficient. In one embodiment, the at least one gradient coil is configured to exhibit fast response when operated in pulsed mode. In one embodiment, the at least one gradient coil is configured to consume less than 1 Ampere when operated in CW mode.

In one embodiment, the miniature imaging probe for an electron spin resonance imaging apparatus further comprises a shield material having electromagnetic shielding properties in the microwave regime, while providing electromagnetic transparency in the megahertz regime.

In one embodiment, the resonator material possesses at least one of the following unique features and advantages for ESR microscopy: a high concentration of electromagnetic [EM] field by high-permittivity dielectric (thereby yielding a high SNR and a small "effective volume" from which the signal is obtained); a proportional concentration of $B_1$ field and correspondingly reduced r.f. (radio-frequency/microwave) input power; a proportional reduction of power dissipation in gradient and modulation coils; a smaller resonator and consequently reduction in the requirement for the volume of homogenous $B_0$, which allows the use of a smaller primary magnet; a minimized resonator volume that alternately permits the use of a permanent magnet assembly (with vernier scan coils) for the $B_0$ field; a non-conducting dielectric ring structure that is inherently immune to eddy current effects. In one embodiment, the construction features facilitate specimen insertion and manipulation (e.g., for precise positional adjustment of high permittivity bio-samples). In one embodiment, the open design permits unimpeded gas flow for temperature stabilization of resonator (for controlled-temperature experiments and removal of heat generated in gradient and modulation coils). In one embodiment, the microwave coupling scheme utilizes microstrip or thin coaxial antenna to obtain high coupling coefficient in limited space without introduction of a deleterious metallic ground plane in sensitive regions (which can cause the reduction of the resonator Q or enable Eddy currents that disturb the magnetic field near the sample). Coupling may also be achieved through the use of a dielectric waveguide antenna. Such an antenna allows the elimination of any metallic parts in the vicinity of the resonator and consequently provides better immunity to eddy currents effects that may arise due to the pulsed field gradients.

In one aspect, the invention features efficient magnetic field gradient coils for CW and pulsed imaging. In the CW embodiment, the coils consume currents of less than 1 A to produce the necessary gradients. In the pulse embodiment, the coils exhibit the fast response necessary for pulsed imaging.

In one aspect, the invention relates to shielding for the imaging probe that comprises a material having electromagnetic shielding properties in the microwave regime, while providing electromagnetic transparency in the megahertz spectral regime, of the applied pulsed field gradients.

In one aspect, the invention relates to the use of stable organic radicals for microscopic calibration and labeling applications. In some embodiments, the organic radicals include, for example, trityl ((tris-(8-carboxyl-2,2,6,6-tetrakis-methyl-benzo[1,2d:4,5-d']bis(1,3)dithiole)methyl), LiPc (Lithium Phthalocyanine radical) and their derivates. In addition, functional and sample preparation aspects related to the invention such as pulsed 2D/3D ESR imaging, sample preparation methods, spectrometer architecture, and CW and pulse current drivers are believed to be novel and patentable.

Other exemplary features of the invention that are believed to be significant include: the possibility in CW mode of varying the phase and or frequency of the excitation of the gradient coils during the integration time to improve the SNR and/or to reduce artifacts; the use of high permittivity material with low losses as components of the imaging probe; the ability to position samples in a millimeter-sized resonator to accuracies of 50 to 100 microns (and proportionally more accurately as the resonator size is reduced); the use of automatically controlled or computer controlled (as compared to manually controlled) high gain amplifiers in baseband amplifier and filtering units; the possibility of using temperature shift at the resonator for tuning the resonance frequency; and the use of many generally known deconvolution methods, and associated computer programs or software modules for obtaining images in the projection reconstruction method.

In some embodiments, data obtained from the use of the ESR microscope may be combined with confocal optical and/or fluorescence microscopy data to provide better assignment of the image and more complete information about the imaged object.

Other types of samples that may be imaged by ESR microscopy are samples for materials science applications (such as paramagnetic semiconductors), samples for botanical applications, and even limbs or organs of small animals (ex-vivo and in-vivo).

In another aspect, the invention relates to the process of operation of an instrument used to obtain magnetic resonance images with a resolution of better than 1×1×5 microns in several minutes of acquisition for small samples.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIGS. 7a-7f show 2D and 3D ESR images acquired using apparatus and methods embodying principles of the invention, and a corresponding optical image.

DETAILED DESCRIPTION OF THE INVENTION

Figure 1:
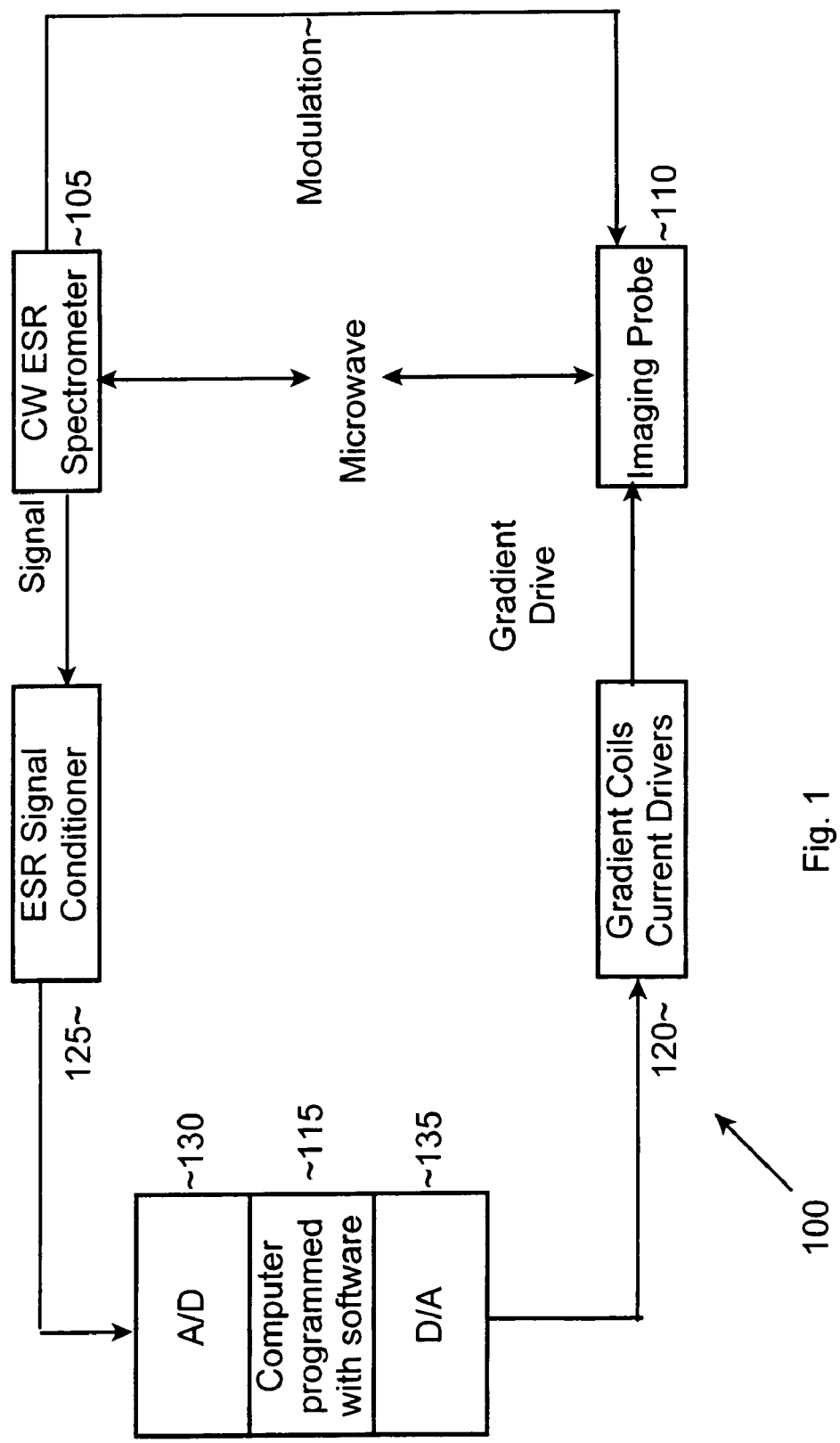
FIG. 1 shows a block diagram of an exemplary CW ESR microscope, according to principles of the invention.

An Electron-Spin Resonance [ESR] (also referred to as Electron-Paramagnetic Resonance [EPR]) microscope is described, and methods of use of the microscope are presented. This imaging system overcomes the resolution limitations of existing NMR-based magnetic resonance microscopy and provides complimentary 3D information to optical microscopy, in a sub-micron resolution. The ESR microscope may be realized as a compact stand-alone instrument or as a retrofit compatible with existing ESR spectrometer instruments. Two distinct means of obtaining ESR micro-images, based on continuous-wave [CW] and pulsed signal acquisition methods, are possible with minor variation of the ESR microscope invention. As used in this application, the term "image" and its variants (e.g., images, imaging, and so forth, whether used as a noun or as a verb) refer to spatially resolved (1D, 2D, or 3D) information that can be obtained about the examined sample, or the act of obtaining such information, using the inventive instruments and methodologies described herein. This information can be any of the spin concentration, the spin relaxation times ($T_1$, $T_2$), the line shape of the spins, the diffusion coefficient of the spin probes, or any other spatially resolved parameters known in the art to be measurable by magnetic resonance imaging techniques.

We describe new instruments and methodology to obtain high resolution (better than 1 micron) magnetic resonance images of small samples (mainly, but not limited to, biological samples) with relatively simple and inexpensive means. The method relies on the imaging of stable radicals, which are affixed to the sample, rather than observing the hydrogen protons or other nuclear spins (as NMR does). The imaging of stable radicals (termed Electron Spin Resonance, or ESR, imaging) is a well known technique commonly employed in the scientific community for more than two decades. It provides similar or, in same cases, even superior information to that obtained by NMR imaging. The process of affixing the stable radicals to the sample is fairly well developed and is similar to applying contrast agents in NMR or fluorescence probes/dyes in optical microscopy. However, the previous resolution obtained by ESR imaging (especially for bio-samples) has been limited to ~0.1 mm for 2D and 3D images. We overcome this limitation and can produce resolution that is better than 1 micron, for a relatively short acquisition time of several minutes, by the combination of a new microwave resonator, efficient gradient coils, advanced imaging algorithms, novel stable radicals used as the imaging media, the use of higher microwave frequencies, and data acquisition technology. Combining these novel subsystems enables us to produce a desktop ESR microscope, based on electromagnet and modern microwave technology that facilitates fast, low cost and reliable magnetic resonance imaging of small samples for a variety of biological, biomedical and materials science applications.

General System Description

The ESR microscope is comprised of a static magnetic field source, a microwave source and a detector, a microwave resonator, a mechanism for sample positioning and alignment, at least one and preferably three gradient coils, optionally bias coils for Field Frequency Lock (FFL) (a mechanism that uses the ESR signal to correct for any magnetic field drifts by means of DC biasing one of the gradient coils within the imaging probe), and a computer for control and data processing. Either continuous-wave or pulsed operational ESR microscopy instruments are possible with appropriate sub-system variations, and have been demonstrated. In the ESR microscope, a primary magnetic field polarizes the electron spins of the free radicals. The gradient coils generate magnetic fields that are added to the static main field and vary across the sample volume to facilitate the spatial resolution of the system. The microwave source excites the spins, producing characteristic signals, which are concentrated by the microwave resonator, then detected, digitized, and analyzed in the computer.

System Features

In the embodiments described herein, the high resolution of the ESR microscope is achieved through the use of one or more of the following system features: 1. a miniature resonator (typical size of 0.3-3 mm, depending on the frequency); 2. efficient gradient coils producing gradients of ~1-10 Tesla per meter (T/m) for one ampere (1 A) of current (for CW and pulsed systems); 3. the ability to apply either or both of integrated modulated-gradient field [MGF] and projection reconstruction [PR] methods for CW imaging; 4. advanced fast pulsed magnetic field gradient current drivers; and 5. high repetition averaging capability for pulsed-mode imaging.

System Capabilities

The systems of the invention described herein have been demonstrated on samples having size: 4×4 mm and ~0.3 mm thick. It is believed that a resolution of better than 1×1×5 micron can be attained (depending on frequency of operation). To date, in some embodiments, ~5×5×10 micron resolution has been attained in pulse mode at 9 GHz, ~3×3×8 micron resolution has been attained in pulse mode at 16 GHz, and ~10×10×30 micron resolution has been attained in CW mode at 9 GHz. Typical image acquisition time is approximately 10 min for a 256×256×64 pixel (or voxel) image in pulse mode and ~60 min for 128×128×32 pixel images in CW mode. The high resolution results (down to sub micron) mentioned should be achieved at higher frequencies, e.g. 35-60 GHz. Different types of images representing different type of information from the same sample, may be obtained through the use of different pulse sequences as known in the art (e.g., image of the radical concentration, image of the lineshape of the radicals, image of the spatially resolved relaxation parameters $T_1$, $T_2$ of the radicals, or the self diffusion coefficients through the use of fixed or pulsed field gradients). It is expected that improved manufacturability or performance will be achieved with further modifications of the apparatus. In one embodiment, the electron spin resonance image has an electron spin sensitivity of $10^6$ spins per voxel for 60 min acquisition at room temperature. It is believed that the electron spin resonance image can have an electron spin sensitivity of $10^5$ spins per voxel for 60 min acquisition at room temperature.

Detailed Hardware Description

CW ESR Microscope

FIG. 1 shows a block diagram of an exemplary CW ESR microscope 100. The CW ESR microscope instrument comprises: (a) a conventional CW ESR spectrometer 105, for example a commercially available CW ESR spectrometer such as a Varian, Bruker, or JEOL instrument, modified with: (b) an imaging probe 110 that includes a microwave resonator, a mechanical fixture for holding the sample, one or more gradient coils (preferably for three orthogonal axes), and a magnetic field modulation coil (which is similar to a CW ESR resonator); (c) a dedicated computer 115 which controls the imaging process and acquires the ESR signal; (d) at least one current driver 120 for the gradient coils (and preferably three current drivers for driving three gradient coils); and (e) a baseband (up to ~250 kHz) amplifier and filter unit (signal conditioner 125) which obtains the raw ESR signal from the CW ESR spectrometer and preconditions it to enable the signal to be digitized, for example by an A/D card. The computer can be any commercially available general purpose programmable computer having sufficient computational power to perform the required computations. The computer can be, for example, a desktop computer, a laptop computer, or another commercially available computation device having memory for holding programmed instructions and data, and input and output ports and devices for accepting instructions from a user and for reporting information to the user in any convenient form. The computer can run data acquisition software (for example LabView version 7 software available from National Instruments, or another user interface comprising a graphical user interface (GUI)), and comprises an analog-to-digital (A/D) card 130 (for example, the PCI-6023 from National Instruments) for data digitization and acquisition. The computer also comprises a digital-to-analog (D/A) card 135 (for example, a PCI analog output card with 8 outputs and an update rate of up to ~200 kHz, such as the PCI-6713 from National Instruments) to generate analog output signals, such as the gradient waveforms for the three imaging axes and the waveform for the modulation coil. The current waveform in the gradient coils can be generated either directly at the computer analog output card or in a control unit as described in the alternative embodiment hereinbelow.

In operation, a sample is loaded into the imaging probe 110. The CW ESR spectrometer 100 applies electromagnetic energy to the imaging probe 110 and receives return signals. The return signals are communicated to the ESR signal conditioner 125 and then passed to the A/D 130 for digitization. The digital signals produced are communicated to the computer 115, which is operating software to analyze the digital signals and to display results to a user. The computer 115 can also communicate control signals to the imaging probe 110 by way of D/A 135 that converts digital signals generated by the computer 115 to analog signals that are communicated to the current drivers 120 which control the signals applied to gradient coils operating in conjunction with the imaging probe. The gradient coils apply gradient signals to the imaging probe 110, thereby spatially encoding the signal detected by the CW ESR spectrometer 105, which spatially encoded signals are then fed back to the computer 115 as previously described. A user or a programmed sequence can command the computer 115 to modify the gradients according to principles that will allow the discovery of useful ESR information about the sample of interest.

Figure 1A:
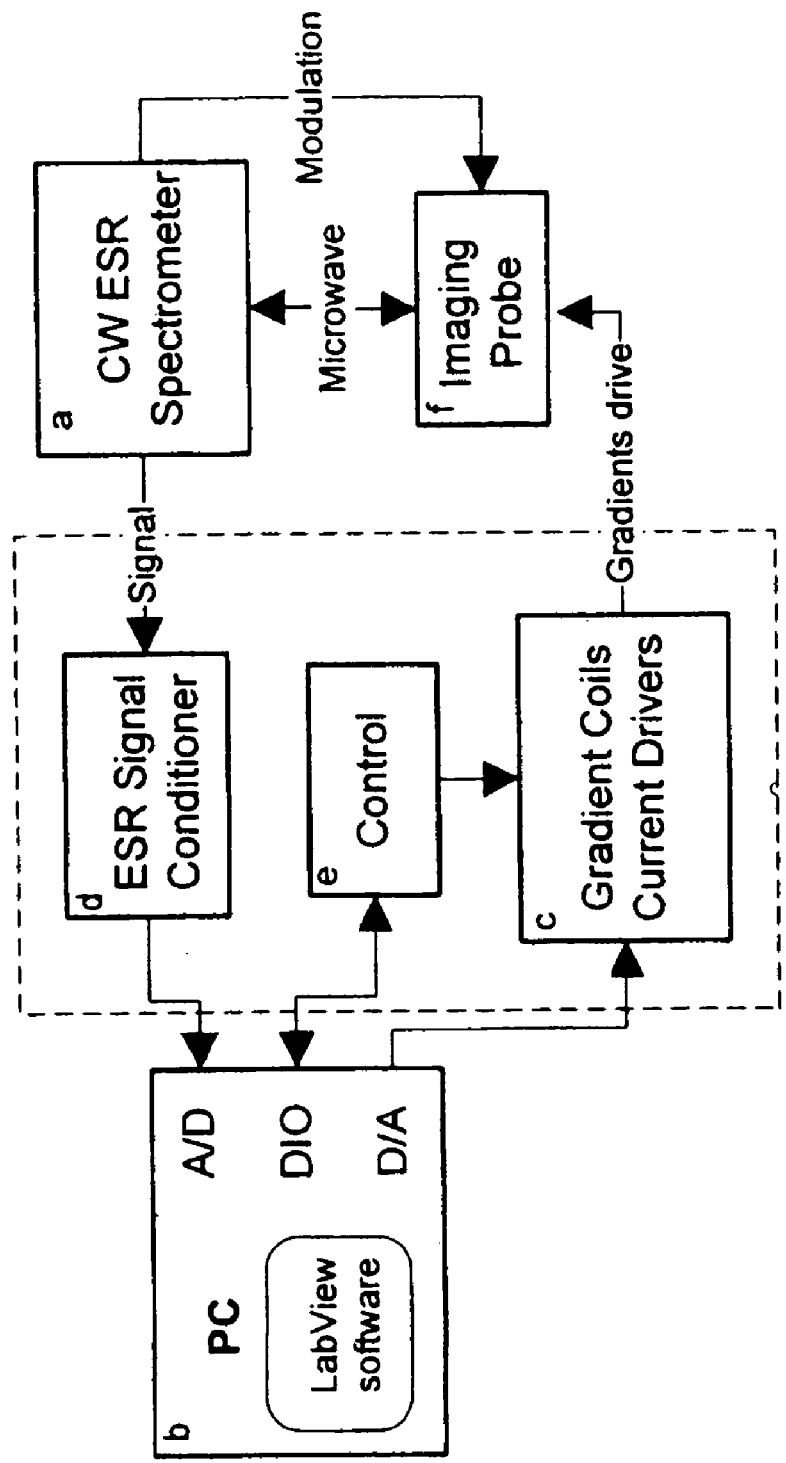
FIG. 1A shows a block diagram of an alternative embodiment of a CW ESR microscope, according to principles of the invention.

FIG. 1A shows a block diagram of an alternative embodiment of a CW ESR microscope, according to principles of the invention. The second embodiment of the CW ESR microscope has the following components: a. conventional CW ESR spectrometer; b. dedicated computer which controls the imaging, process and acquires the ESR signal; c. current drivers for the gradient coils; d. baseband (up to ~250 kHz) amplifier and filter unit (signal conditioner); e. control unit; and f. imaging probe that includes the microwave resonator, mechanical fixture for holding the sample, and gradient coils.

To image a sample, one must first attach the imaging probe (described in greater detail with respect to FIG. 3a-3d hereinbelow) to the CW ESR spectrometer (by replacing the conventional resonator). The imaging probe is connected to the spectrometer through the microwave (MW) input/output of the spectrometer and the modulation coils line (similar to any CW-ESR resonator). In addition, the probe is connected to the gradient current drivers and to air and water cooling lines. The water and air cooling lines are useful to maintain a stable resonance frequency of the high permittivity resonator (FIG. 3b). The investigated sample should be sealed (under normal or deoxygenated atmosphere) between two flat glass cover slips and inserted, with the help of the sample holder, to a well-defined, closely controlled position in the center of the resonator. Following this, the ESR spectrometer is set to acquire the signal of the sample at the required conditions of MW power, static magnetic field, and main modulation. After fixing the spectrometer on the maximum of the ESR signal, the computer controlled imaging procedure is initiated, and the gradient coils are activated to obtain the image. In some embodiments, the ESR microscope incorporates a Field Frequency Lock (FFL) system that adjusts the main (static) magnetic field by biasing the modulation coils of the imaging probe, and maintains the on-resonance condition throughout the period of the imaging experiment. The FFL mechanism uses the ESR signal to correct for any magnetic field drifts by means of a bias coil within the imaging probe that determines the local static field at the sample (large electromagnet field+bias coil field). Thus, the basic commercial CW ESR spectrometer is completely "unaware" of the imaging procedure, with the interfaces between the spectrometer and the imaging probe/system being kept to a minimum. The image is displayed on a monitor connected to the computer in real time during the acquisition process and then can be saved and/or manipulated as necessary.

CW ESR spectrometer. Most commercial CW ESR spectrometers (e.g. from Bruker, Varian, or JEOL) can be used as a basis for the imaging module. The spectrometer serves as a stable, amplitude controlled, MW source that is independently frequency locked on the resonance frequency of the imaging probe, by means of the spectrometer Automatic Frequency Control (AFC). The spectrometer also provides a current drive for the regular modulation coils of the imaging probe and should allow for the operator to fix the external static magnetic field close to the resonance field of the imaged sample. The MW ESR signal returning from the imaging probe is detected by the spectrometer and is pre-amplified (and otherwise conditioned) at the spectrometer MW bridge. In the case of a spectrometer (Varian E-12), we inserted prior to the diode detection of the ESR signal from the resonator a low noise X-band pre-amplifier (Miteq AFS3-08001200-14-ULN). This amplifier improves the SNR of the spectrometer by a factor of ~5 and its amplification gain (~25 dB) enables the AFC of the Varian bridge to lock on the returning signal even for low MW power (~1 $\mu$W), a power level that is common in the present imaging technique. The diode detected baseband signal is directly fed from the bridge pre-amplifier (similar to the case of Time Resolved ESR measurements) to a signal conditioning unit and then goes to the PC for sampling and further analysis.

Control computer and imaging software: The entire imaging process is controlled by a computer, such as a standard personal computer (PC), equipped with an analog input+digital I/O card (for example, National Instruments 6023E) and an analog output card (for example, National Instruments 6713). These cards enable arbitrary waveform generation and fast sampling of signals up to several hundred kHz. The digital analysis of the sampled diode detected ESR signal supersedes the need to employ a conventional lock-in amplifier while simultaneously obtaining all the ESR signal harmonics, in the correct phase, with respect to the main modulation current. In one embodiment, the software operating on the system is capable of acquiring 2D images at any given location (using 3D slice selection), 3D images, and 4D spatially resolved ESR line shape (spectral-spatial projection reconstruction imaging). The imaging methods that can be employed are either the PR or the MFG method. Both methods can in principle employ the MFG method for Z slice selection. The control software (based on LabView) obtains the imaging parameters from the user. These parameters include, for example, the number of pixels in the image (along the x and y axes), the current amplitude in the gradient coils, the waveform and frequency used in the modulated gradient coils (e.g., sine, serrasoid, etc.), the image extent in mm, and parameters related to the functionality of the FFL system. The software can also acquire the normal ESR signal (first and second harmonics), by sweeping the magnetic main (static) field with the probe's gradient coils. At the end of the imaging process the data can be saved and/or further processed with the aid of Matlab software or other similar mathematical manipulation software. Such post processing includes, for example, in the case of image acquisition through the PR method, de-convolution of the projections and inverse Radon transformation to obtain the image.

Current drivers for the gradient coils: The gradient coils are driven by six programmable current sources, one current source for each coil, each capable of supplying up to 3 A of arbitrary waveform current, in the DC-10 kHz range. Each current driver is based on a simple feedback loop. In practice, the coils in the present system do not require more than 1 A to generate high enough gradient fields. The low current consumption of the system greatly simplifies the design and space requirements for the driver unit.

Baseband amplifier and filter unit (signal conditioner): In most ESR spectrometers, the ESR signal, detected by the MW diode, goes through a baseband preamplifier that is part of the commercial bridge. In some embodiments, the signal level after this pre-amp is not high enough to be sampled directly by the A/D card in the computer. To facilitate proper A/D sampling we employ a signal conditioning unit comprising band-pass filters and a high gain amplifier. The dual band-pass filter transfers only signal at the regular modulation frequency generated by the CW spectrometer, and its second harmonic. In one embodiment, there is provided a filter that transfers 25 kHz and 50 kHz and the spectrometer is operated at 25 kHz modulation frequency. The high gain amplifier (such as the Tektronix AM502) that follows the dual band-pass filter produces variable gain (which in some embodiments can be manually controlled) in the range of 40-100 dB.

Control unit: The current waveform in the gradient coils can be generated either directly at the computer analog output card or optionally in the control unit. If the computer analog output card is used, the control unit is optional. The control unit receives commands from the computer via the 8 bit digital Input/Output (I/O) bus of the 6023E card and subsequently synthesizes the required waveforms. The control unit is limited in the complexity of the waveform it can generate (as compared to the arbitrary waveform generator of the analog output card), but for most imaging tasks it has sufficient capabilities. Its usefulness is that it reduces the overhead time in the imaging procedure related to the calculation and generation of the different waveforms in the computer and thus shortens the actual acquisition time by a factor of ~2. Computer systems operating a high enough clock speeds do not require the use of a control unit, but can perform all of the necessary calculations and control operations directly.

Imaging probe: The imaging probe is an important component of the CW imaging system. A schematic drawing of the imaging probe is given in FIG. 3a. The probe is based on a double stacked ring resonator, machined from $SrTiO_3$ single crystal (Commercial Crystals, FL. USA). This crystal has permittivity of ~300 at room temperature and tan $\delta$~$5\times10^{-4}$. Each one of the resonator rings is 0.55 mm in height with outer diameter of 2.31 mm and inner diameter of 0.81 mm. When the two rings were placed at a separation of ~0.4 mm, the fundamental resonance frequency of this structure was found to be ~9.15 GHz (in the center of the working frequency of the Varian E-12 ESR spectrometer). The resonator is excited by a microstrip transmission line on a low-loss substrate (GE electromaterials GTEK ML200D Epoxy/Polyphenylene Oxide resin). The excitation geometry and the calculated fields of this resonator at the resonance frequency have been calculated using CST Microwave Studio. The "effective volume" of the resonator, as derived from the calculated magnetic fields is ~3 $mm^3$ for a ring separation of 0.4 mm. The two high permittivity rings are held by a Delrin part at a fixed distance (see FIG. 3b). This Delrin spacer also holds the flat sample and enables precisely controllable positioning of the imaged object in the center of the resonator. Variable coupling is achieved by changing the distance between the resonator rings and the microstrip line using a linear 1D stage (for example, the non-magnetic model MDE 255 from Elliot Scientific, GB). In addition, the vertical position of the rings with respect to the microstrip line can be varied slightly by moving the Delrin part up and down and/or adjusting the vertical microstrip line position. This variability enables optimal control of the rings' coupling, for a wide variety of samples.

The resonator rings are surrounded by a thin (for example, 0.12 mm thick) hollowed brass cylinder that shields the resonator at the microwave frequencies, but is transparent to the low frequency magnetic field gradients. The regular modulation of the CW spectrometers (commonly at 25-100 kHz) penetrates through the shield opening along the cylinder axis. The loaded Q of the resonator was found to degrade slightly, from ~1200 to ~900, when inserting it into the brass shield. The gradient X, Y, and Z coils are arranged around the cylindrical shield, along with the regular modulation coils. The gradient coils are made from bondable 38 AWG copper magnet wire, and the modulation coils are made from bondable 32 AWG wire. The innermost coils are the Y and Z gradient coils respectively, which are based on a "Golay" design. The X gradient coils (for example, a standard Maxwell pair), are positioned in the outermost layer of the gradient coils, followed by the main modulation Helmholtz pair. Gradient efficiency is 4, 5, and 1.2 T/(m*A), and coil resistance is 9, 8.5, and 4.4 $\Omega$ for the X, Y, and Z coils respectively. These figures significantly improve upon an earlier 2D probe design, which achieved gradient efficiency of ~1.5 and 2.5 T/(m*A), for the Y and X coils respectively, with coil resistance of 8 $\Omega$.

Figure 4:
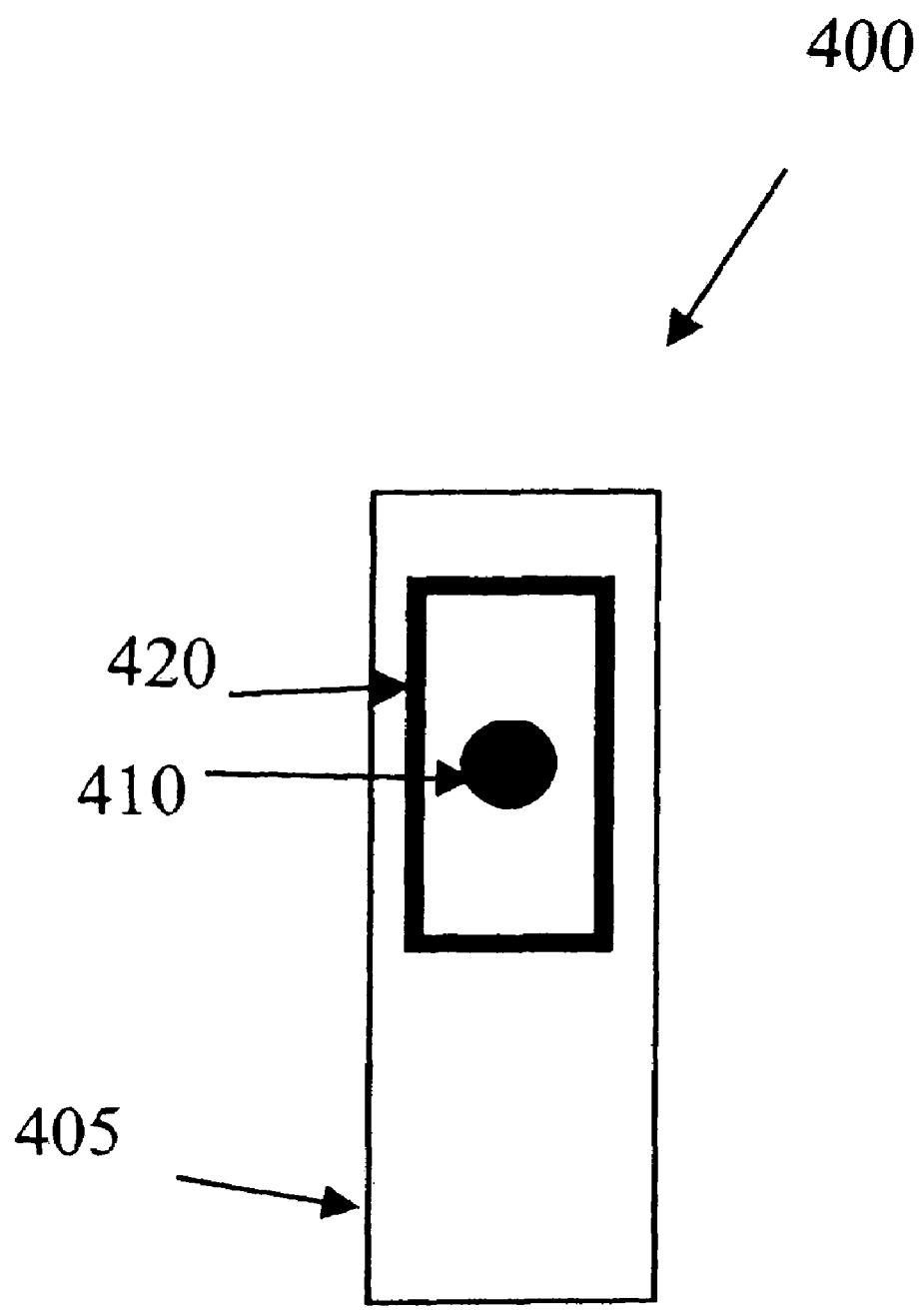
FIG. 4 shows an exemplary sample container, according to principles of the invention.

The probe structure is cooled by water flow, which maintains the entire brass structure at constant temperature. In addition, the rings themselves are cooled by air or He flow to maintain a stable resonance frequency, since the $SrTiO_3$ is highly sensitive to temperature changes (at X-band the drift is ~20 MHz per ° K.). In principle, the water/air flow system can be temperature controlled to regulate the temperature in the range (~0-50° C.). The imaging probe can accommodate flat samples with dimensions of ~1.5×1.5 mm (corresponding to the active area/volume of the probe) and a height of up to ~0.5 mm (depending on the separation of the resonator rings). In practice, for liquid samples, one should contain the sample in a glass structure. It is convenient to employ thin cover slips with a small acid etched "well", as a convenient container for the liquid samples, as described hereinbelow (FIG. 4). Such a design enables one to measure a net sample size of ~1.5×1.5 mm and a height of ~0.25 mm. These samples can be sealed, if necessary, under Argon atmosphere, by the use of UV curable glue.

The spin sensitivity of the imaging probe was measured with a 1 mM deoxygenated water solution of protonated trityl radical. An SNR of $1.6\times10^4$ was obtained for a 0.06 µL sample, with 1 s time constant and ~0.2 G field modulation. This SNR is in good agreement with the results of our recent prediction of an SNR of $1.8\times10^4$ for such a trityl sample. The measured SNR corresponds to a spin sensitivity of $2.2 \times 10^9$ spins/$\sqrt{Hz}$, and a concentration sensitivity of $\sim 6.2 \times 10^{-8}$ M/$\sqrt{Hz}$, for the flat sample considered here. The combination of high spin and concentration sensitivities, for samples of small volume, is very helpful to facilitate high resolution imaging capability.

As noted above, the system can employ two different imaging methods to obtain the ESR image, within the framework of CW acquisition. Some of the results discussed herein were obtained with the PR method, which is a common method used to acquire in-vivo CW-ESR images. This tomographic imaging technique has been described in detail in many previous publications, and we shall not elaborate on it herein. Other results presented here were collected employing the MFG method. This method is less commonly employed since it is mainly advantageous for microscopic applications. The MFG method has been described previously, with discussions of the image acquisition technique, image Signal-to-Noise-Ratio (SNR), and gradient coil requirements. Nevertheless, we include here, for clarity, a short outline of this method, and also present a discussion of image resolution in 2D and 3D imaging, as a function of the modulated field gradient amplitude.

The idea behind the MFG method is to over-modulate the entire imaged sample, apart from a single voxel, from which the ESR signal is obtained. The over-modulation of the sample is achieved by a set of gradient coils excited by a low frequency periodic current. These coils have a null field point that can be swept in space by changing the relative current amplitude in each coil that produces the gradient field. Let us analyze more quantitatively the imaging scenario and obtain the image resolution for various cases. The time domain CW ESR signal in the case of conventional field modulation is given by (equation [1]):

$$S(t, B_\delta) = S_0 / \{[\Delta B_{1/2}/2]^2 + (B_\delta + B_m \sin \omega_m t)^2\}$$

where $\Delta B_{1/2}$ is the Full Width Half Maximum (FWHM) of the ESR line; $B_\delta = (B - B_0)$, where $B_0$ is the center of the line; $B_m$ is the modulation field amplitude (at a frequency of e.g. 100 kHz). The addition of sinusoidal modulation fields, whose amplitudes depend both on time and the spatial location, results in the following spatial/time domain signal (equation [2]):

$$S(x, y, z, t, B_\delta) = S_0 / \{[\Delta B_{1/2}/2]^2 + [B_\delta + B_m \sin \omega_m t + B^x_z(x) \sin \omega_x t + B^y_z(y) \sin(\omega_y t + \phi_y) + B^z_z(z) \sin(\omega_z t + \phi_z)]^2\}$$

The modulated field gradients for the X, Y, and Z axes—$B^x_z$, $B^y_z$, $B^z_z$, and of course the main modulation field, $B_m$, are all in the direction of the laboratory Z-axis (determined by $B_0$). The field $B_m$ is assumed to be homogenous over the entire sample volume (i.e., without any spatial dependence). The modulated field gradients are employed at much lower frequency (e.g. 10-1000 Hz), and have the following spatial dependence (equations [3]):

$$B^x_z = x G_x$$

$$B^y_z = y G_y$$

$$B^z_z = z G_z$$

It is thus clear that at the origin, where $(x,y,z)=(0,0,0)$, the second equation simplifies to the first equation. At other locations however, the ESR signal is greatly attenuated, due to the over-modulation induced by the modulated gradients, and this attenuation increases as the voxel is more distant from the origin. The origin (null field point) can be moved by changing the ratio of the currents in the pairs of coils, which generate the modulated field gradients. The entire image is obtained by electronically scanning the imaged voxels within the sample volume.

We shall now address the issue of image resolution. Qualitatively, it is clear that the image resolution should be finer as $G_x$, $G_y$, and $G_z$ increase. In addition, the gradient modulation frequencies $\omega_x$, $\omega_y$, $\omega_z$, the relative phases between the gradient modulation ($\phi_y$, $\phi_z$), and also the time constant of the CW ESR signal acquisition affect the image resolution. In order to provide quantitative analysis of these factors, we examine the ESR signal harmonics (with respect to the main modulation frequency). These harmonics are detected by the CW ESR spectrometer and are given (for the $p^{th}$ harmonic) by:

$$a_p = \int_{t=0}^{T} S(x, y, z, t, B_\delta) \sin(p \omega_m t) dt \quad [4]$$

If $B^x_z = B^y_z = B^z_z = 0$, then each harmonic signal has a specific field, $B_\delta = B^m_\delta$, for which it is maximal (for example, for the second harmonic signal, $B^m_\delta = 0$). As one increases $B^x_z$, $B^y_z$, and/or $B^z_z$, the amplitude of $a_p$ at $B^m_\delta$ will decrease and quickly reach zero. To calculate the image resolution, for a specific signal harmonic p, we first find the field $B^m_\delta$ and then increase $B^x_z$, $B^y_z$, and/or $B^z_z$ (depending on the dimensionality) in our numerical calculations of $a_p$, until $a_p$ at $B^m_\delta$ becomes zero. The values of $B^x_z$, $B^y_z$, and/or $B^z_z$ for which $a_p = 0$, divided by the applied gradient (equation [3]), provides us the image resolution. This resolution is analogous to the Rayleigh criterion for resolution in optics.

The calculations of the resolution were performed numerically for several representative cases. We assumed for purposes of this analysis that $\omega_x = \omega_y = \omega_z$ (although the system can support different frequencies for the X, Y, and Z gradient coils, see below). Also $G_x = G_y = G_z = G$, and the integration time, T, in equation [4] was taken as the period time of $\omega_x$. The relative phases, $\phi_y$ and $\phi_z$, are determined according to the dimensionality of the problem: When increasing the dimensionality of the image (e.g., from 1D to 2D), every point in space experiences the added fields of more than one coil pair. This can lead to "interference effects," through which strong image artifacts are created if $\phi_y = 0$, since the resolution depends on the direction taken from the null point. To avoid such artifacts, one should apply a phase difference between the modulated fields of the different axes. In the 2D calculation, we employed an optimal $\phi_y = 90°$, and in the 3D example we applied $\phi_y = 120°$, $\phi_z = 240°$. This approach tends to minimize the spatial dependence of the resolution (i.e., image artifacts) by averaging out the positive and negative interference effects. Similar artifact cancellation can be achieved by employing different modulated gradient frequencies for each axis. Both methods (i.e., phase and/or frequency variation amongst the imaging axes) can be employed in our imaging system.

Imaging procedure. We have outlined the imaging process from the perspective of the operator of the system. The actual processes that occur "behind the scenes" are more involved and warrant some discussion. Two representative examples are described for the MFG and the PR imaging methods.

We describe typical representative input and output signals for a 3D MFG imaging experiment with FFL control, namely the current in the gradient coils (channels $X_1$, $X_2$, $Y_1$, $Y_2$, $Z_1$, $Z_2$), the regular modulation coils (mod) and the resulting first and second harmonics ESR signals (S1 and S2 respectively). The modulated gradient coils operate at a typical frequency of $\sim$10-200 Hz. Each imaging axis may have its own distinct frequency or relative phase (to control and avoid image artifacts). The current ratio between the amplitudes of the coil pairs (for example $X_1/X_2$) determines the position of the null field for that specific pair while the current amplitude of both coils determines the resolution of that axis. At the end of the acquisition period of a single voxel (typically 1-1000 ms), in one embodiment, the system pauses to process the data, update the output buffer of the computer/controller and observe the signal without any modulation to correct for any frequency/field variation (the FFL mechanism). The current in the gradient coils is set to zero at the "rest" period to observe the bulk sample signal. The current in the X coils is not zero at the "rest" period since it includes a common-mode DC bias employed for the FFL field corrections, which is why the sine modulation of this coil pair is offset from zero. The FFL correction mechanism relies on the first harmonic signal, $S_1$ (which should be zero at resonance), while the image signal is obtained from the second harmonic signal $S_2$, during the modulation period.

Typical representative input and output signals for 2D/3D projection reconstruction (PR) imaging experiment with FFL control are described. The X and Y coil pairs provide a gradient along a specific angle ($\tan \delta = Y_1/X_1$). The current within a certain coil pair (for example $X_1$ and $X_2$) is not necessarily equal. This enables one to shift the origin in the XY image plane. The scan of the main (static) magnetic field (to obtain the projection) is performed with the Z coils. For optional Z-slice selection by the modulated field gradient method, one can superimpose a sinusoidal waveform on top of the scan Z-field. In some embodiments, the superimposed modulated field is at a typical frequency of ~10-200 Hz. In addition, in this case the Z coil pair also compensates for field drifts (FFL) so the waveform of these coils also has some DC bias superimposed. As in the previous case, at the end of the scan (or possibly several times within the scan, if the scan is long) the acquisition process pauses to obtain the un-modulated/zero gradient signal from the sample and to correct the FFL accordingly. The signals $S_1$ and $S_2$ show a typical projection (e.g., a signal reminiscent of the second derivative of a square wave, or the first derivative of a pulse) that occurs at each of two small point-like radical grains.

Pulsed ESR Microscope

We now turn to the description of a 3D electron spin resonance (ESR) micro-imaging system, operating in pulse mode at 9 GHz and 16 GHz. This pulsed-mode system is capable of obtaining 3D images with typically 256×256×64 voxels in a resolution of ~5×5×10 µm (9 GHz), and ~3×3×8 µm (16 GHz), at ~10 min of acquisition time and with voxel SNR of up to ~200. The detection sensitivity at room temperature is ~$1.2\times10^9$ spins/$\sqrt{Hz}$ (9 GHz), and ~$6\times10^8$ spins/$\sqrt{Hz}$ (16 GHz), which enables the measurement of $2\times10^7$ (9 GHz), ~$1\times10^7$ (16 GHz) spins in each voxel after 60 min of acquisition. The resolution and detection sensitivity are the best obtained so far for ESR at ambient conditions of temperature and pressure. This ESR microscope can be employed to study a variety of problems in botany, life and materials science.

The high spatial resolution, image size, SNR and short acquisition time is the current state-of-the-art of any magnetic resonance microscopy technique (ESR and NMR), which can be readily applied to a wide variety of biological, botanical and materials science applications. In contrast to NMR, the short time scale of ESR experiments (ns up to µs) makes it difficult to employ many pulsed imaging techniques, which require short microwave pulses, short and intense pulsed field gradients, and a fast acquisition and data averaging system.

Figure 2:
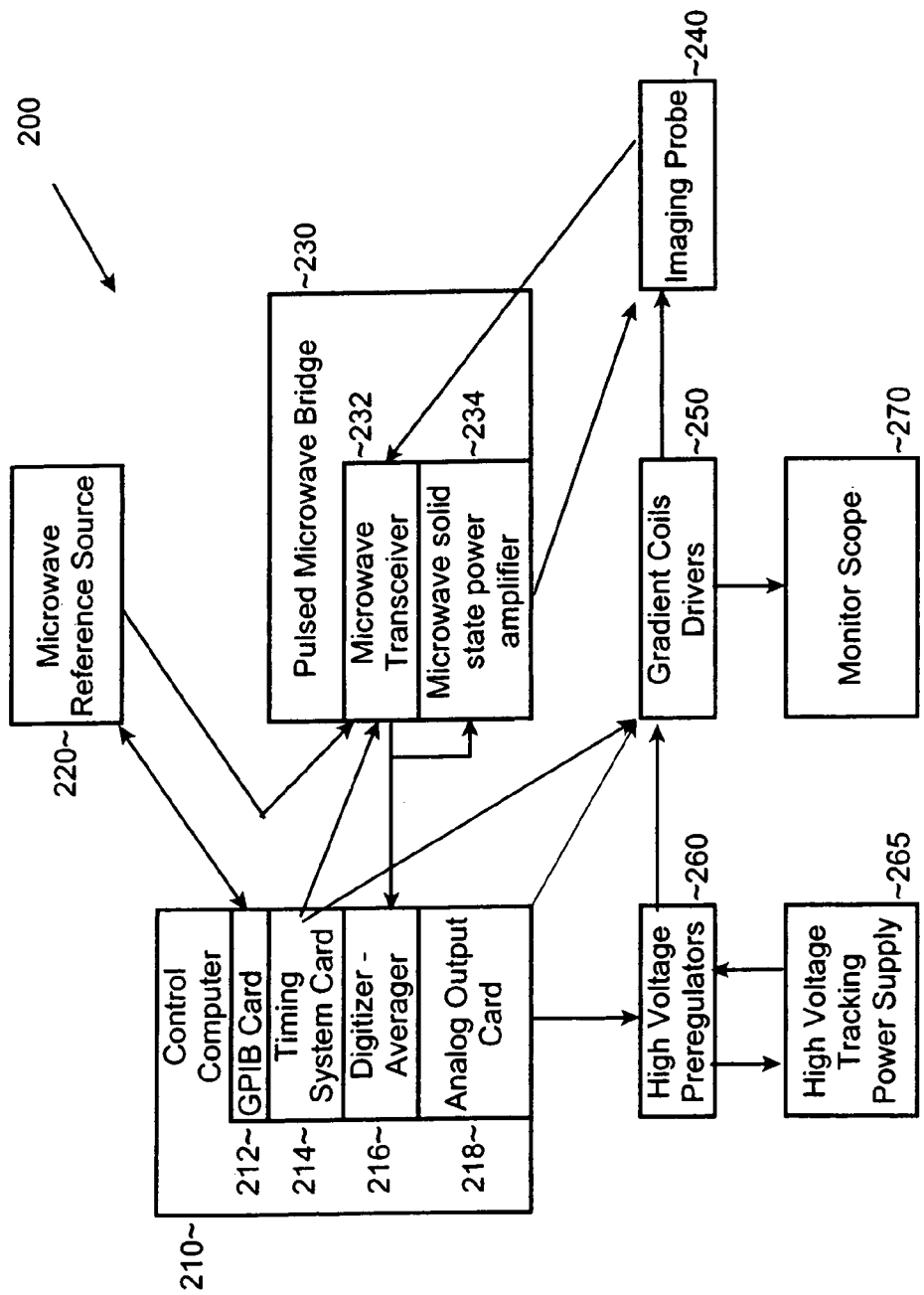
FIG. 2 shows a block diagram of an exemplary pulsed ESR microscope, according to principles of the invention.

FIG. 2 shows a block diagram of an exemplary pulsed ESR microscope 200. The pulsed ESR microscope comprises a control computer 210 which in some embodiments includes a General Purpose Interface Bus (GPIB) card 212, a timing system card 214, a digitizer-averager 216, and an analog output card 218. The pulsed ESR microscope 200 also comprises a microwave reference source 220. The pulsed ESR microscope 200 also comprises a pulsed microwave bridge 230 that includes a microwave transceiver 232 and a microwave solid state power supply 234. The pulsed ESR microscope 200 also comprises an imaging probe 240, one or more (and preferably three orthogonal) gradient coil drivers 250, high voltage preregulators 260, a high voltage tracking power supply 265, and an output device such as a monitor scope 270.

The control computer 210 and the pulsed microwave bridge 230 can communicate with all of their respective components. In FIG. 2, additional communication paths in the pulsed ESR microscope 200 are indicated by arrows. In the pulsed ESR microscope 200, the GPIB card 212 signals the microwave reference source 220. The timing system card 214 signals the microwave transceiver 232 and the gradient coil drivers 250. The analog output card 218 signals the gradient coils drivers 250 and the high voltage preregulators 260. The microwave reference source 220 signals the microwave transceiver 232. The microwave transceiver 232 signals the digitizer-averager 216 and the microwave solid state power amplifier 234 and receives back the ESR signal from the imaging probe 240. The microwave solid state power amplifier signals the imaging probe 240. The gradient coils drivers 250 signal the imaging probe 240 and the monitor scope 270. The high voltage preregulators 260 are in bi-directional communication with the high voltage tracking power supply 265.

The computer 210 controls the overall image acquisition process through the use of software that provides a user interface, for example LabView version 7 or other software that provides a GUI with general purpose hardware control. The timing system card 214 is some embodiments is a commercial PCI card with multiple TTL outputs, time resolution of 10 ns, programming time of ~10 µs and minimal pulse length of 50 ns, such as the PulseBlaster Model 100-24 from SpinCore, FL., USA. In a preferred embodiment, the timing system has a time resolution of 1 ns. In some embodiments, the digitizer-averager 216 is a commercial 8-bit digitizer card for raw data acquisition and can average two (2) channels at a sampling rate of 100 MHz or greater, can average up to 1 M waveforms/sec, and has a memory depth of 1 Mbyte, such as the AP-240 from Acqiris, Switzerland. In some embodiments, the analog output card 218 is a PCI-6711 or a PCI-6713 card from National Instruments. In some embodiments, the microwave reference source 220 is a synthesized source having power output of ~10 dBm at the 2-18 GHz range, such as HP8672A or the HP8620C. In a preferred embodiment, the microwave reference source 220 is a stable phase locked dielectric resonator oscillator (DRO) source. In some embodiments, the low power pulsed microwave bridge 230 comprises a 6-17 GHz low power transceiver 232 and a solid-state power amplifier 234, such as an amplifier having 2 W output, 40 dB gain such as those of Quinstar, CA. USA. In a preferred embodiment, the solid state power amplifier is an amplifier with power output of 4-10 W. In one embodiment, the transceiver 232 is a homodyne transceiver that incorporates one transmission channel with bi-phase modulation, which controls the individual pulse phase (e.g. 0° or 180° for echo phase cycling), or with quadrature phase capability (0°, 90°, 180° or 270° phase cycling).

In overview, the operation of the pulsed ESR instrument may be described as follows: the system computer 210 controls the timing system card 214 to initiate a pulse sequence in the microwave bridge transceiver 232 and in the pulse gradient current driver unit 250. The excitation pulses (after amplification) and the gradient current go into the imaging probe 240. The echo signal from the imaging probe 240 is detected in the transceiver 232, sampled and averaged by the fast digitizer 216 and then processed in the computer 210.

In operation, the timing system triggers the transmission pulses, determines the bi-modulator phase, and provides triggers for the PIN diode protection of the receiver while transmitting the high power pulses. The relatively low power output of the transceiver is sufficient to provide hard 90° pulses of ~50-80 ns with the small resonator used. The pulsed gradient coils in the imaging probe are driven by a pair of gradient coil drivers fed by pre-regulated high voltage power supplies. The gradient coils driver has four channels. Two of the channels can generate large (up to ~8 A peak) half sine current pulses by pre-charging a capacitor and subsequently discharging it into the gradient coil. The capacitor voltage is determined by the pre-regulated high voltage power supply, and is proportional to the analog voltage it receives from the analog-output card. The two remaining channels produce constant DC current into one of the axes of the gradient coils and into a bias coil, which produces a static field and is used to lock the magnetic field on the resonance frequency of the spins by sampling the FID signal without any gradients and correcting for any field drifts.

Figure 3:
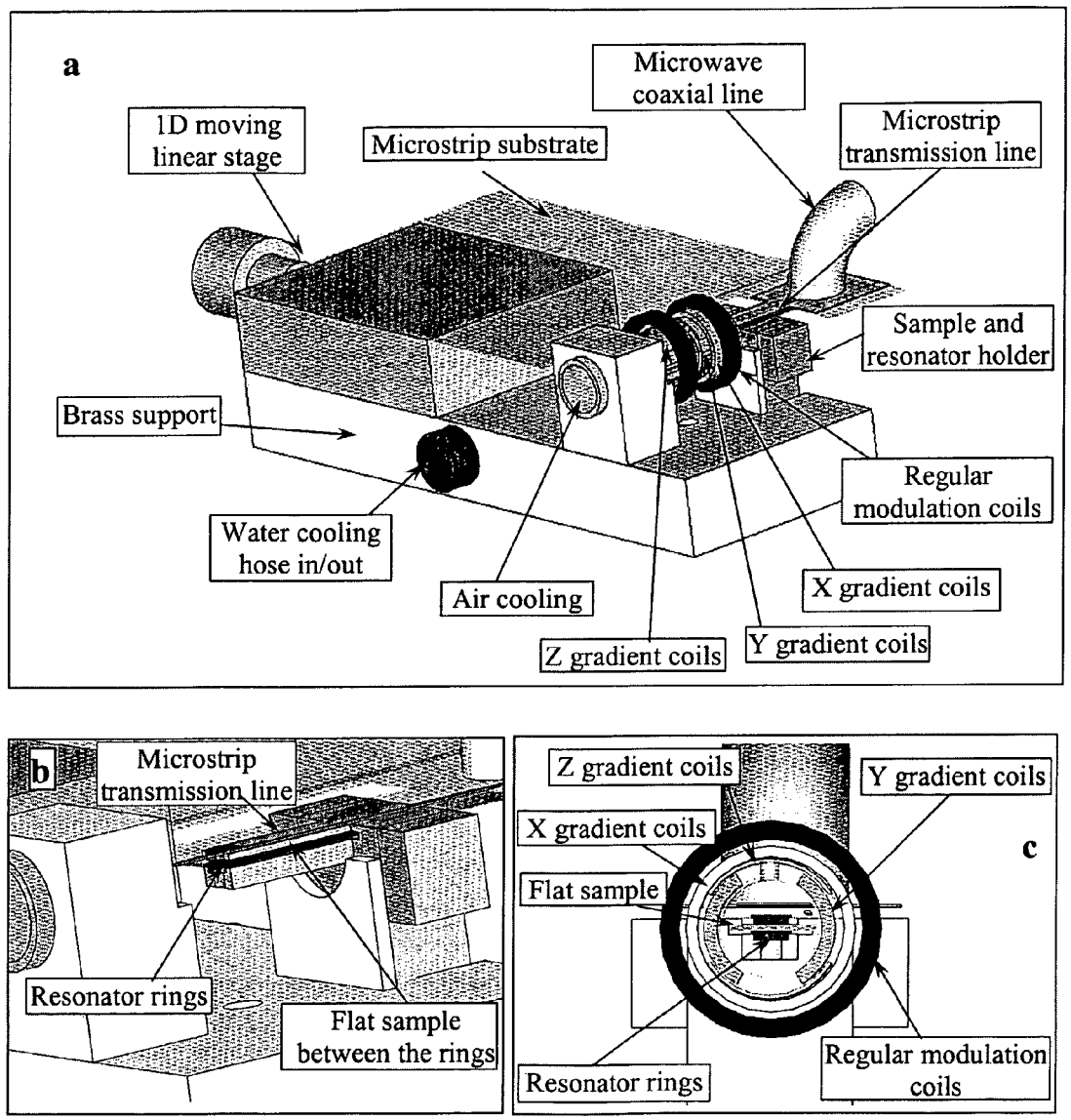
FIGS. 3a, 3b, and 3c show schematic drawings of an exemplary imaging probe, according to principles of the invention.
FIG. 3d is an exploded view of an embodiment of three orthogonal gradient coil pairs, according to principles of the invention.

The imaging probe is shown generally in FIG. 3 hereinbelow, and is similar to the 9 GHz miniature 3D probe employed for CW ESR imaging. The main differences between the CW and the pulsed probes are in the structure of the gradient coils and the microwave resonator shield. The y- and z-axis gradient coils (based on Golay geometry) are optimized for pulsed currents, and have relatively small inductance of ~6.5 μH. They produce a gradient of 1.6 and 1.1 T/(m*A) (for the y- and z- axis respectively, measured with pick-up coil at 1 MHz), when the coil pairs are connected in parallel. The x-axis gradient coil operates in DC mode (Maxwell pair), and has inductance of ~90 μH, and a gradient efficiency of 3.5 T/(m*A) (when the coil pair is connected in series). In one embodiment, a very thin gold foil (~0.2 μm) is used as a shield between the coils structure and the microwave resonator. This prevents the microwave field from escaping the resonator structure, while simultaneously enabling the transmission of the magnetic field pulse gradients into the resonator structure without producing any potentially disturbing eddy currents. The resonator has a loaded quality factor at critical coupling of ~400, and an effective volume of ~3 mm$^3$.

The performance of the system was verified with respect to theoretical predictions of SNR and image resolution. The SNR was measured at 9 GHz for 0.05 mm$^3$ sample of 1 mM water solution of protonated trityl radical containing ~3×10$^{13}$ spins. The measured single shot SNR (without any gradients) of ~100 agrees well with theory, which predicts an SNR of ~75 for this small sample. This corresponds to detection sensitivity at room temperature of ~1.2×10$^9$ spins/$\sqrt{Hz}$, which enables the measurement of ~2×10$^7$ spins in each voxel after 60 min of acquisition. Similar measurements at 16 GHz found detection sensitivity of ~6×10$^8$ spins/$\sqrt{Hz}$,.

Imaging Probe

FIGS. 3a, 3b, and 3c show schematic drawings of an exemplary imaging probe. FIG. 3a is a diagram showing the imaging probe in perspective view. In FIG. 3a one can see the relative positions of a support, for example made of brass, which includes a water cooling circuit (not shown, that is provided with cooling water by the inlet/outlet show. A one-dimensional (1D) precision linear translation stage is provided to permit the movement of the sample/sample holder within the probe. In more complex devices, a plurality of precision translation stages can be provided to allow the sample to be manipulated in a plurality of directions. In FIG. 3a, one also sees the sample and resonator holder, the modulation coils, the X, Y, and Z gradient coils, and an air cooling aperture. Microwave power is applied by a microstrip transmission line that is connected to a power supply with a microwave coaxial line.

FIG. 3b is a perspective drawing showing the resonator, a microstrip transmission line, and a Delrin sample and resonator holder when the various modulation coils are absent.

FIG. 3c is a drawing showing the probe structure as seen from the direction of an air cooling hose, showing the layout of the modulation coils with respect to the resonator rings.

Figure 3D:
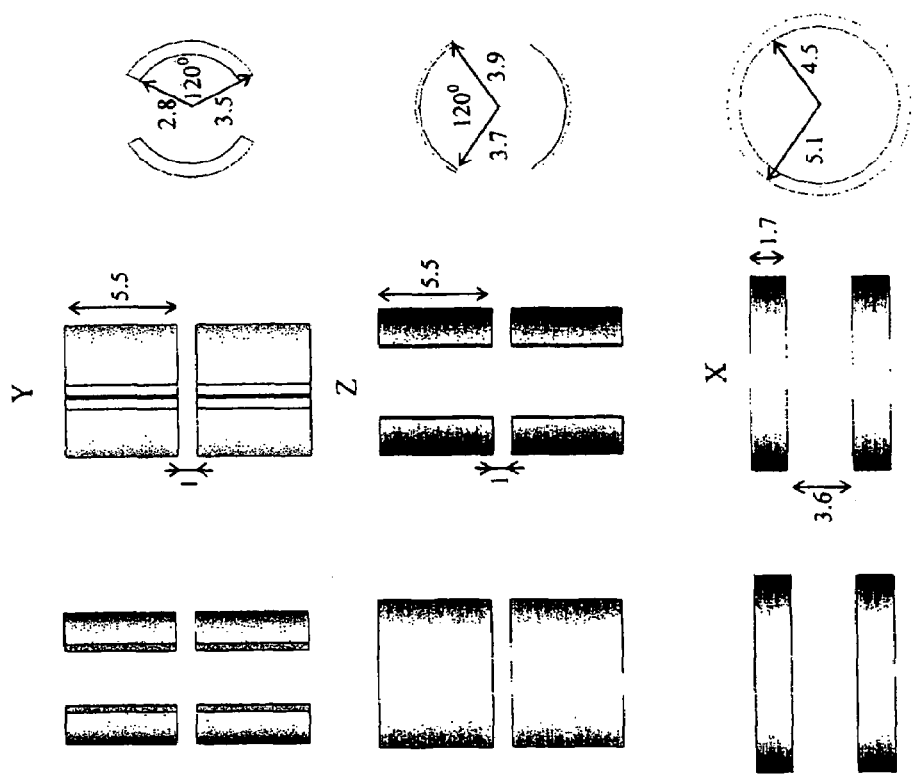

FIG. 3d is an exploded view of an embodiment of three orthogonal gradient coil pairs. The dimensions are given in millimeters for the embodiment shown. The main modulation coils that are used with this embodiment are a Helmholtz pair having a separation of 5 mm and a radius of 6 mm.

As shown in FIGS. 3a-3d, the miniature ESR imaging probe comprises a resonator and at least one gradient coil. In preferred embodiments, there are provided gradient coil pairs for each of three orthogonal axis directions. In one embodiment, the microwave resonator is made of high permittivity material (typically $\epsilon$>100). In one embodiment, the microwave resonator is made from SrTiO$_3$ single crystal rings. In one embodiment, the resonator material possesses at least one of the following unique features and advantages for ESR microscopy: a high concentration of electromagnetic [EM] field by high-permittivity dielectric (thereby yielding a high SNR, and a small "effective volume" from which the signal is obtained); a proportional concentration of B$_1$ field and correspondingly reduced r.f. (radio-frequency/microwave) input power; a proportional reduction of power dissipation in gradient and modulation coils; a smaller resonator and consequently reduction in the requirement for the volume of homogenous B$_0$, which allows the use of a smaller primary magnet; a minimized resonator volume that alternately permits the use of a permanent magnet assembly (with vernier scan coils) for the B$_0$ field; a non-conducting dielectric ring structure that is inherently immune to eddy current effects. In one embodiment, the construction features facilitate specimen insertion and manipulation (e.g., for precise positional adjustment of high permittivity bio-samples). In one embodiment, the open design permits unimpeded gas flow for temperature stabilization of resonator (for controlled-temperature experiments and removal of heat generated in gradient and modulation coils). In one embodiment, the microwave coupling scheme utilizes microstrip or thin coaxial antenna to obtain high coupling coefficient in limited space without introduction of a deleterious metallic ground plane in sensitive regions (which can cause the reduction of the resonator Q or enable Eddy currents that disturb the magnetic field near the sample). Coupling may also be achieved through the use of a dielectric waveguide or wire antenna. Such antennas allow the elimination of any metallic parts in the vicinity of the resonator and consequently provide better immunity to eddy currents effects that may arise due to the pulsed field gradients.

The gradient coils shown in FIGS. 3a-3d are efficient magnetic field gradient coils for CW imaging. In the CW embodiment, the coils consume current of less than 1 Ampere (1 A) to produce the necessary gradients. The X, Y, and Z gradient coils are arranged around the cylindrical shield, along with the regular modulation coils. In one embodiment, the gradient coils are made from bondable 38 AWG copper magnet wire, and the modulation coils are made from bondable 32 AWG wire. The innermost coils are the Y and Z gradient coils respectively, which are based on a "Golay" design. The X gradient coils (which in some embodiments are a standard Maxwell pair), are positioned in the outermost layer of the gradient coils. The main modulation Helmholtz pair of coils are outside the X gradient coils. In some embodiments, gradient efficiencies of 4, 5, and 1.2 T/(m*A), and coil resistance of 9, 8.5, and 4.4 Ω for the X, Y, and Z coils, respectively, are observed. In general other similar arrangements can be made in which the order of the coils (e.g., which is innermost and which is outermost) may be interchanged.

The efficient magnetic field gradient coils shown in FIG. 3a-3d can be used for pulsed imaging. The same resonator can be used for CW and pulse with only the gradient coils interchanged. The gradient coils for pulse differ from the CW by their lower inductance, which enables them to exhibit the fast response necessary for pulsed imaging (rise and fall times of ~50 ns). Also, in the pulse mode the shielding for the imaging probe that comprises a material having electromagnetic shielding properties in the microwave regime, while providing electromagnetic transparency in the megahertz spectral regime, of the applied pulsed field gradients.

Sample Container

FIG. 4 shows an exemplary sample container 400. In one embodiment, the sample container 400 is fabricated in a glass slide 405 or cover slip. A circular sample well 410 is etched in one surface of the sample container 400. A rectangular trough 420 is etched along the periphery of the glass object, which rectangular trough 420 serves as a stop line for cement that is applied to the glass cover slip for bonding to a similar glass cover slip (not shown) that is used as a cover to protect the sample. When the cement is applied to the periphery of the glass slip and the cover is positioned, the rectangular trough 420 prevents the cement from being squeezed into the sample well 410. As may be understood, the rectangular trough 420 can be replaced with a trough of a different geometry that circumscribes the sample well 410.

The sample container of FIG. 4 is used for lossy liquid-like samples. In one embodiment, it is made of thin ~100-500 micron rectangular (3-5 mm wide, ~10-20 mm long) cover glass 405 that is etched by acid to produce the patterns as shown. The sample is placed in the circular etched groove 410, which conforms to the location of the magnetic field RF lines of the ESR resonator (once the sample is centered in the imaging probe). In some embodiments, the diameter of the etched circular groove 410 is ~200-2000 microns, and the depth is ~50-400 microns. These dimensions are useful for minimizing the dielectric losses. The sample container is sealed by a similar cover glass with UV curable glue applied along the borders of the container (separated from the liquid sample by the rectangular groove).

Figure 5:
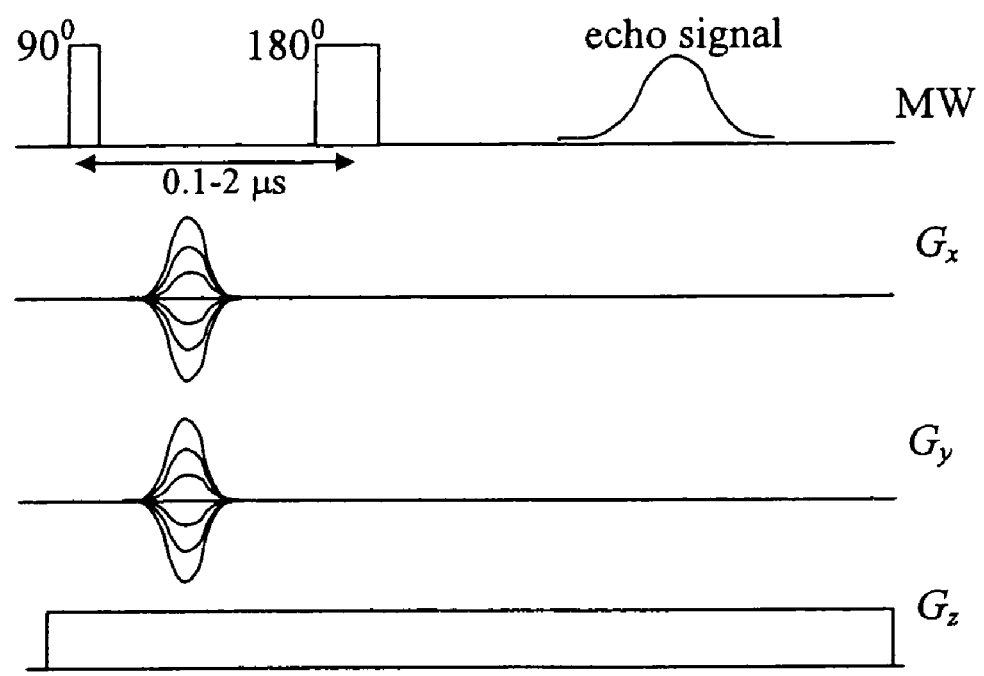
FIG. 5 shows an exemplary imaging sequence for pulsed ESR imaging, according to principles of the invention.

FIG. 5 shows an exemplary imaging sequence for pulsed ESR imaging. In one embodiment, the imaging sequences employed in the pulsed ESR micro-imaging system are based on a simple primary-echo with constant gradient that encodes the spins along the x-axis with different frequency, and two phase gradients for encoding the information on the yz plane. Hard 90° and 180° pulses are used to excite all the spins in the sample. This sequence can be repealed every ~$T_1$. In this embodiment, because of limits in available amplifier power, we employed two 80 ns 90° pulses rather 90° and 180° pulses.

Examples of Image Acquisition

We now present some examples of information obtained using the instruments and methods described hereinabove. The examples include both CW and pulsed imaging methodologies, and include a number of different specimen types. In CW, these observations enable us to quantify the resolution, SNR and image quality obtained in 2D and 3D measurements with the MFG and the PR methods, which provides a good basis for comparison and discussion about their different advantages and disadvantages. In pulse mode, these results demonstrate the upper limits of the system performance.

Figure 6A:
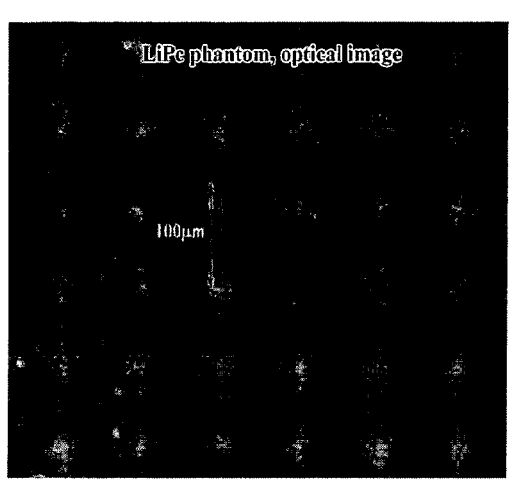
FIG. 6 shows an example of a CW ESR image of a solid test sample, according to principles of the invention.
Figure 6B:
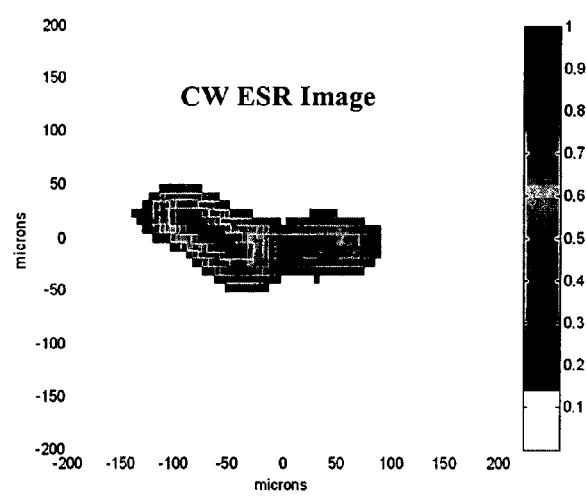

A small phantom of LiPc (lithium phthalocyanine radical) crystal was used to examine the resolution limits of an embodiment of a CW ESR imaging system, since this material has high spin concentration in each voxel (resulting in high SNR) and narrow linewidth, <0.01 mT (under nitrogen atmosphere). FIG. 6a shows an optical image of the phantom at low magnification, with the Nylon mesh seen at the left of the image serving as a scale. FIG. 6b shows a typical CW ESR imaging result for this sample, obtained with the MFG method when employing gradients of 1.2 T/m. The net image acquisition time (for 64×64 pixels) is 2 min. However, due to current limitations of the data acquisition equipment, the experiment actually took ~15 min. The image SNR (max signal from a voxel divided by the RMS of the noise in areas of the image where no radicals are present) was found to be ~110. These images can be compared with our theoretical estimates of image SNR, and the spin sensitivity of the probe described above. The radical concentration is ~$10^{20}$ spins in 1 cc (provided that the material density is ~1), which implies that there are $8 \times 10^{11}$ spins in an image voxel of 10×10×80 microns. We know that Q~1000, and the resonator active volume is ~3 mm$^2$ and we also assume $T_1$ and $T_2$ values similar to that of 1 mM trityl radical in water solution. All these parameters result in an estimated SNR of ~150 for the MFG method (considering the $2^{nd}$ harmonic signal). Accurate absolute predictions of the image SNR (and the ESR signal in general) are somewhat problematic and the present results provide relatively good agreement to the theoretical predictions, and are also compatible with the measured probe spin sensitivity described herein.

With respect to the image resolution, a reasonable definition for resolution would be: "the smallest distance between two point samples, which still enables them to be resolved separately." However, it is difficult to produce such "point" samples of spins accurately in the micron scale. Nevertheless, the resolution of the image can be estimated from a one dimensional cut through the object, similar to what is done in NMR microscopy.

Thus, after analyzing the ESR images by taking a 1D cut at certain locations one reveals that the measured resolution is ~10×10 microns for the 2D images acquired with both methods, and ~30 microns for the z slice separation in the 3D images (the latter number is less reliable due to the difficulty of accurately measuring the crystal Z dimension, which is estimated to be ~80 microns). The image in FIG. 6b involves gradients of 1 T/m, radical linewidth of 0.01 mT and main modulation field of 0.015 mT, which results in the calculated 2D resolution of 9.5 μm (for the second harmonic signal).

The 2D ESR image of FIG. 6b does not correspond exactly to the optical image of FIG. 6a. This may be caused by 1) an inhomogeneous distribution of spins within the phantom (corresponding to the weak signal on the right side). In addition, 2) application of cyanoacrylate glue, during sample preparation, destroyed some of the radicals in the lower part of the phantom. The very similar results using both ESR imaging methods reinforces our belief that the ESR images are correct, and it shows that the optical image and ESR image do not have to be the same (as one would expect), since they measure different properties.

LiNc-BuO radical: Recently, a new type of LiPc derivative was synthesized. This material, termed LiNc-BuO (Lithium octa-n-butoxy-substituted naphthalocyanine radical), can be applied to biological samples in-vivo/in-vitro as a high concentration micro-particulate liquid suspension. The linewidth of this radical increases significantly with increasing oxygen concentration. FIGS. 7a-7f present 2D and 3D ESR images, acquired with the MFG and PR methods, of a test sample, which contains these radicals in a solid form. The sample was prepared in the following manner: A UV laser ($\lambda$=193 nm, Lumonics PM-848k excimer laser) was used to drill three small pits in a thin (150 µm) glass cover slip. The position of the center of the pits can be controlled to a high degree of accuracy (~0.2 µm) with an XY table. However the geometry of the pits depends on the shape of the laser beam, which tends to be oval rather than perfectly round, and also changes along the pit depth. A high resolution optical microscope (Olympus) was used to measure the typical pit dimensions (~25-40 µm, depending on the position along the depth), and to estimate the depth of the pits (as marked on FIG. 7f). The glass with the 3 pits was placed in a 10 mM LiNc-BuO suspension and then was taken out and its surface was cleaned with a sharp knife.

The line width of the LiNc-BuO radical in the partially oxygenated sample is 0.03 mT. FIG. 7a shows part of a 2D ESR image acquired with the PR method. The original image was obtained using 128 sampling points of 128 projections (in equal intervals at 0-360 deg), gradients of 2 T/m, time constant of 100 ms per point, and image acquisition time of 27 min. FIG. 7b shows a 2D ESR image of the same glass target (without any Z-slice selection), acquired with the MFG method, XY gradients of 1.2 T/m, a time constant of 0.4 s. The total image acquisition time for the 64×64 pixels is 27 min. FIG. 7c shows a 3D ESR image acquired with the MFG method employing Z-slice selection to observe only the upper part of the glass. The X, Y and Z gradients were all ~1.2 T/m, the microwave power used was ~40 µW (larger than the LiPc case due to the relatively wide linewidth of this radical), and regular modulation amplitude of ~0.05 mT was applied. The time constant was 0.4 s, and the image acquisition time (for 64×64 voxels) was 27 min. FIG. 7d shows the same region as FIG. 7a, but for Z slice selection of the center of the glass. FIG. 7e shows the same region as FIG. 7b, but for Z slice selection of the bottom of the glass. FIG. 7f shows an optical microscope image of the measured sample. The numbers near each radical spot represent the depth of the pit.

The 2D images of this sample (FIG. 7a-b), acquired with the PR and MFG methods, show good agreement with one another and also correspond well to the optical image (FIG. 7f). The apparent increase in image "noise" (as compared to the 3D images in FIGS. 7c-7e) is probably due to the signal from residual radicals left on both sides of the glass (that are largely eliminated in the 3D image). One important issue that is evident from these 2D images is that the PR image has fewer pixels than the MFG image. This is due to the fact that in the PR method one has to acquire information from the entire sample and cannot collect information from only a small part of the sample (as the MFG can). In the present case, there were residual signals from the glass surface and the edges of the glass. These signals had to be collected with the PR method, which resulted in a rather large image of ~2×2 mm, with only 90×90 pixels (after inverse Radon transform of the 128 projections, each with 128 samples). This is a disadvantage for PR in microscopy applications. The 3D ESR image of the upper side of the glass (FIG. 7c) follows closely the optical image, but with an additional small signal that is probably due to some residual radicals that were not removed from the glass surface. FIGS. 7d-7e show the gradual disappearance of the signal from two out of the three pits, due to their different depths (FIG. 7f), as the imaging slices observe different parts of the glass. Again, some residual signal may arise from radicals left on the upper and lower surfaces of the glass.

It is difficult to supply meaningful quantitative analysis of image SNR in this case due to the lack of a good assessment of spin density in the pits and the problem of residual radicals on the glass surface that create effective "noise". However it is clear that this radical provides the possibility to look at very fine details on the order of ~30 microns in a short acquisition time of several minutes. In terms of image resolution, the theoretical resolution for this radical, that (for the present sample) has a linewidth of ~0.03 mT, is ~36 microns. This rather low resolution is apparent in the broadening of the signal from the small pits, but still enables good separation between the pits that are separated ~70 micron apart (from edge to edge).

Figure 8A:
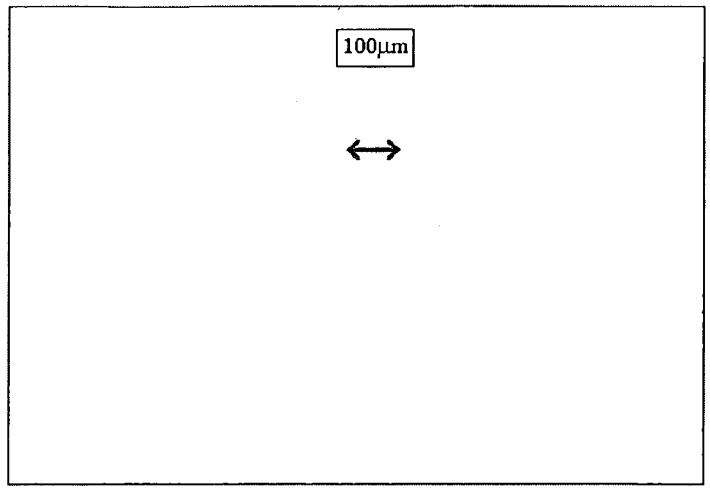
FIG. 8a is an optical image of a LiNc-BuO liquid suspension in a thin nylon mesh.
Figure 8B:
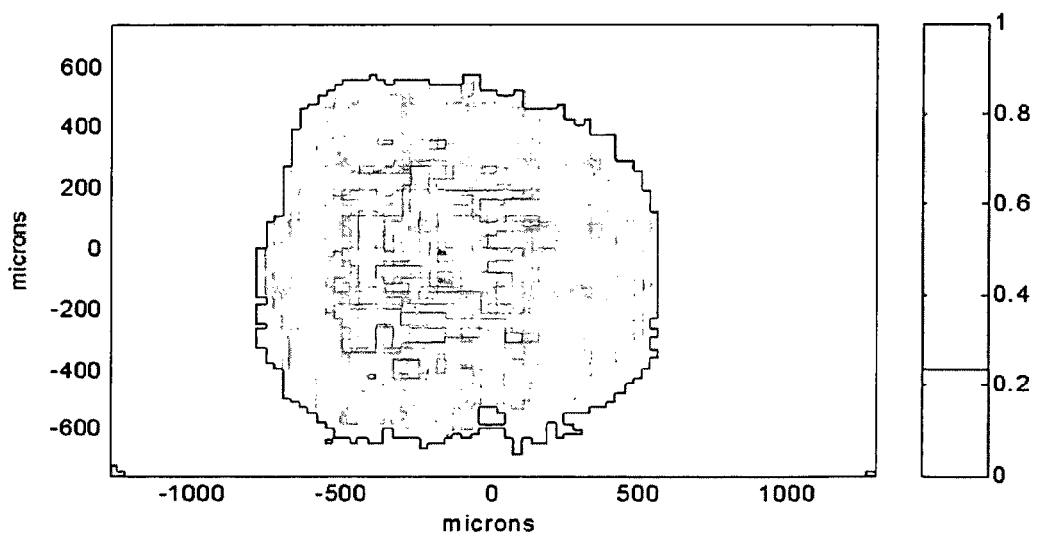
FIG. 8b is an ESR image of the LiNc-BuO liquid suspension obtained according to principles of the invention.

Another imaging example, which is more relevant to biological applications involves a liquid suspension of the same LiNc-BuO radical, obtained with the PR method for a suspension (10 mM concentration) embedded within a fine nylon mesh (obtained from Goodfellow USA; mesh aperture 50 µm, and wire size 39 µm). FIG. 8a is an optical image of the LiNc-BuO liquid suspension in the thin nylon mesh. FIG. 8b is an ESR image of the liquid suspension. The gradients in X and Y were 2 T/m and regular modulation field was 0.05 mT. The image was acquired by collecting 128 projections (0-360 deg) with 128 sampling points at each projection, using a 20 ms time constant per sampling point. The total image acquisition time was 6 min.

The PR is the method of choice when one requires fast imaging of the entire sample in order to obtain, for example, morphological information. Following the acquisition of the PR image one can optionally observe in more detail some specific voxels within the sample (employing the MFG). The ESR image (FIG. 8b) clearly shows: 1) the separation of the compartments in the mesh, and 2) that the signal is obtained only from the active area of the resonator. An interesting point that should be noted is that such radical suspensions are usually employed in in-vivo imaging studies with ~1 mm resolution, and in this scale the suspension is rather uniform. However, at the 10 micron scale, the suspension is not uniform and some of the areas contain larger grains than other areas (as can also be seen in the optical image). This non-uniformity is manifested in the ESR micro-image.

Figure 9:
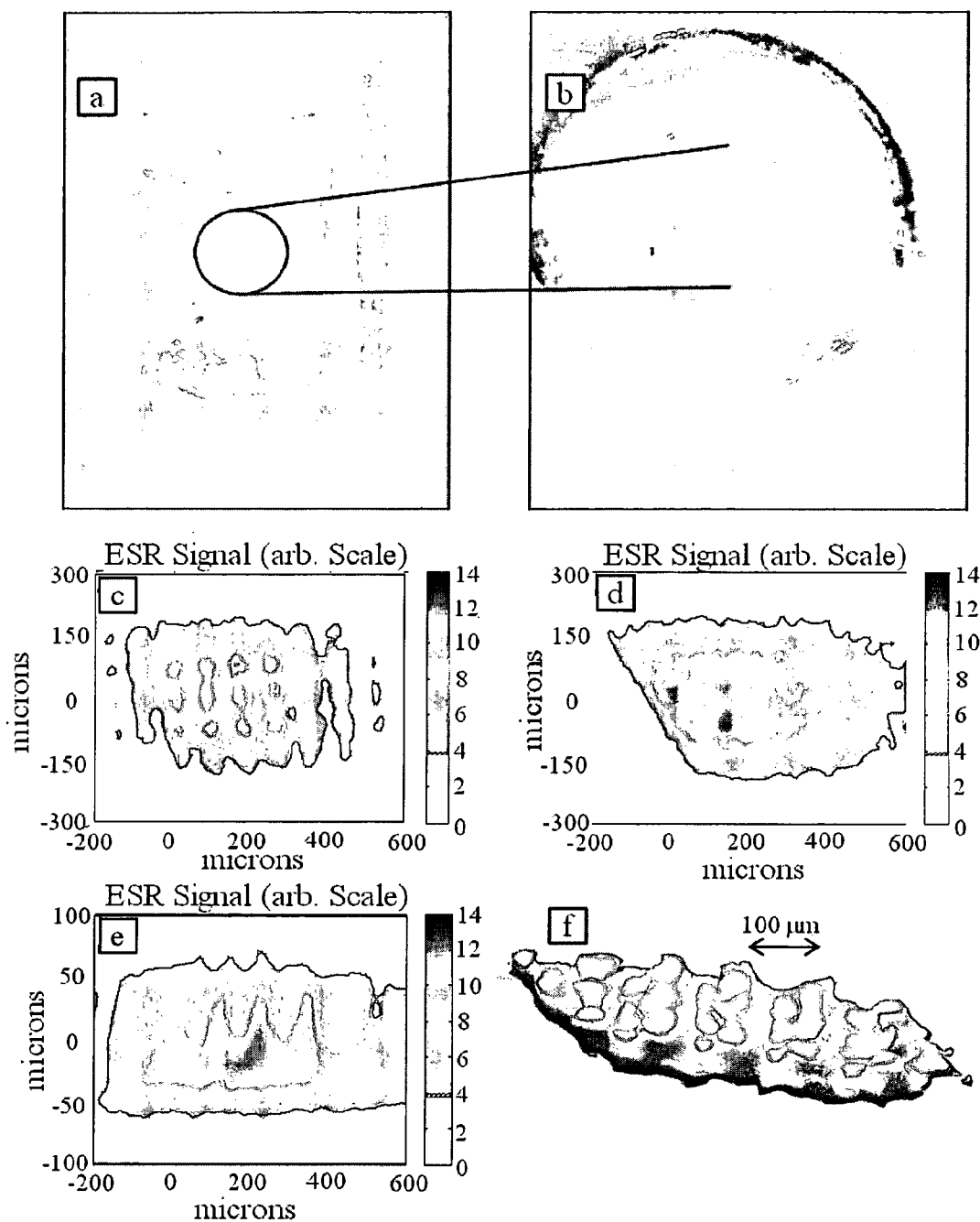
FIG. 9 shows an example of a pulsed ESR image of a liquid sample typical of a biological specimen, and a corresponding optical image, according to principles of the invention.

FIG. 9 shows an example of a pulsed ESR image of a liquid sample typical of a biological specimen. This specimen was prepared using a trityl solution embedded in a fine woven Nylon mesh with mesh aperture of 50×50 µm and wire diameter of 39 µm. This type of sample has well defined 3D geometry and known spin concentration. In FIGS. 9a and 9b, the optical images show the circular area inside the imaging probe (the white annular ring in FIG. 9b). In FIG. 9c, there is shown a single z slice of the 3D ESR image showing the mesh. In FIG. 9d, there is shown another z-slice which corresponds to the slice of the solution below the mesh. In FIG. 9e, a vertical cut through the sample (in the zy plane) is observed. In FIG. 9f, there is shown a reconstruction of the total solution volume shown in FIG. 9d. The sample x axis is the vertical axis in all images. The limited bandwidth of excitation with the 80 ns pulse restricts the image extent along the x-axis.

The 3D image comprising 256×256×50 voxels was acquired after 40 min. The theoretical calculated image resolution is 8.8×10.5×19 µm. The actual measured resolution can be estimated from the sample features as they resolve in the ESR image. If we adopt the Rayleigh resolution criterion, we should be able to resolve in the xy-plane two ~10 µm voxels with signal separated by a ~10 µm voxel without signal. The sample is not fine enough to directly obtain such information but it readily shows excellent separation between the 50 μm voxels separated by the 39 μm wires. The separation along the y-axis is of better quality than that along x-axis. This is due to the Lorentzian line shape that decreases very slowly and results in less resolved image when operating constant gradients than in the case of phase gradients. The z axis shows good separation along the ~90 μm high sample wherein the lower part of the image, one clearly see only the solution and on the upper part, the ~39 micron high mesh. The single voxel SNR is ~40. Since we have $6 \times 10^5$ spins per $[1 \, \mu m]^3$, or $\sim 10^9$ spins per imaged voxel, the agreement between the image SNR and the predicted/measure results is very good.

Machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes.

Those of ordinary skill will recognize that many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. An electron spin resonance (ESR) instrument for producing a magnetic resonance image of a specimen comprising:

a miniature gradient coil; and
a miniature microwave resonator operably connected to the miniature gradient coil, wherein:
the magnetic resonance image is an electron spin resonance image,
the electron spin resonance image has a resolution of at least 10×10×30 microns,
the electron spin resonance image is acquired in a time period of less than 10 minutes, and
the miniature microwave resonator applies an RF magnetic field for electron spin excitation and receives a resulting ESR signal.

2. The electron spin resonance instrument of claim 1, wherein said electron spin resonance image has a resolution of 5×5×10 microns.

3. The electron spin resonance instrument of claim 1, wherein said electron spin resonance image has a resolution of 3×3×8 microns.

4. The electron spin resonance instrument of claim 1, wherein said electron spin resonance image has a resolution of 1×1×5 microns.

5. The electron spin resonance instrument of claim 1, wherein said electron spin resonance image has an electron spin sensitivity of $10^6$ spins per voxel for 60 min acquisition at room temperature.

6. The electron spin resonance instrument of claim 1, wherein said electron spin resonance image has an electron spin sensitivity of $10^5$ spins per voxel for 60 min acquisition at room temperature.

7. The electron spin resonance instrument of claim 1, wherein said instrument operates at a frequency in the range of 9 to 60 GHz.

8. The electron spin resonance instrument of claim 1, wherein said electron spin resonance is continuous-wave electron spin resonance (CW ESR).

9. The electron spin resonance instrument of claim 8, comprising:
(a) a conventional CW ESR spectrometer;
(b) an imaging probe comprising a microwave resonator, and one or more gradient coils in electrical communication with said CW ESR spectrometer;
(c) a signal conditioner for receiving, amplifying and conditioning said signal from said ESR spectrometer and providing an amplified and conditioned signal as output;
(d) a computer which controls an imaging process and processes said conditioned output signal; and
(e) at least one current driver for the gradient coils, said at least one current driver being controlled during said imaging process and driving at least one of said gradient coils.

10. The electron spin resonance instrument of claim 9, wherein said signal conditioner is a filter and a base band amplifier.

11. The electron spin resonance instrument of claim 10, wherein said baseband amplifier operates up to a frequency of 250 kHz.

12. The electron spin resonance instrument of claim 9, further comprising a mechanical fixture for holding a sample.

13. The electron spin resonance instrument of claim 9, further comprising:
(f) a control unit.

14. The electron spin resonance instrument of claim 1, wherein said electron spin resonance is pulsed electron spin resonance.

15. The electron spin resonance instrument of claim 14, comprising:

(a) a computer which controls the overall image acquisition process through a user interface;
(b) a timing system;
(c) a digitizer;
(d) an analog output device;
(e) a microwave reference source;
(f) a low power pulsed microwave bridge;
(g) a low power microwave transceiver;
(h) a solid-state power amplifier;
(j) at least one pair of gradient coil drivers;
(i) at least one power source for driving said at least one pair of gradient coil drivers;
(k) an imaging probe;
(l) a high voltage tracking power supply; and
(m) a monitor scope.

16. The electron spin resonance instrument of claim 15, wherein said computer is a personal computer.

17. The electron spin resonance instrument of claim 15, wherein said user interface is a graphical user interface.

18. The electron spin resonance instrument of claim 15, wherein said timing system comprises a plurality of TTL outputs, time resolution of less than or equal to 10 ns, programming time of 10 μs or less, and minimal pulse length of less than or equal to 50 ns.

19. The electron spin resonance instrument of claim 15, wherein said analog output system comprises at least four analog outputs and an update rate of at least 200 kHz.

20. The electron spin resonance instrument of claim 15, wherein said microwave reference source comprises a power output of approximately 10 dBm through the 2-18 GHz range.

21. The electron spin resonance instrument of claim 15, wherein said low power microwave transceiver operates in the 6-17 GHz range.

22. The electron spin resonance instrument of claim 15, wherein said low power microwave transceiver is a homodyne transceiver that comprises one transmission channel with bi-phase modulation, which controls the individual pulse phase.

23. The electron spin resonance instrument of claim 22, wherein said individual pulse phase is a selected one of 0°, 90°, 180°, and 270°.

24. The electron spin resonance instrument of claim 1 further comprising a signal conditioner.

25. The electron spin resonance instrument of claim 24 further comprising means for coupling the miniature microwave resonator to the signal conditioner.

26. The electron spin resonance instrument of claim 1 further comprising a microwave bridge.

27. The electron spin resonance instrument of claim 26 wherein the microwave bridge is a CW ESR spectrometer.

28. The electron spin resonance instrument of claim 26 wherein the microwave bridge is a pulsed microwave bridge.

29. The electron spin resonance instrument of claim 1 wherein the RF magnetic field is a microwave magnetic field.

30. A miniature imaging probe for an electron spin resonance imaging apparatus, comprising a miniature microwave resonator and at least one gradient coil, wherein:
the miniature microwave resonator applies an RF magnetic field for electron spin excitation and receives a resulting ESR signal, and
the gradient coil is compatible with ESR operation at a frequency in the range of 9 to 60 GHz.

31. The miniature imaging probe for an electron spin resonance imaging apparatus of claim 30, wherein said miniature microwave resonator comprises high permittivity material.

32. The miniature imaging probe for an electron spin resonance imaging apparatus of claim 31, wherein said high permittivity material has a non-conducting dielectric ring structure.

33. The miniature imaging probe for an electron spin resonance imaging apparatus of claim 30, wherein said miniature microwave resonator is temperature stabilized by gas flow.

34. The miniature imaging probe for an electron spin resonance imaging apparatus of claim 30, further comprising a selected one of a microstrip, a dielectric antenna, and a coaxial antenna to obtain a high coupling coefficient.

35. The miniature imaging probe for an electron spin resonance imaging apparatus of claim 30, wherein said at least one gradient coil exhibits fast response to driving-current pulses when operated in pulsed mode.

36. The miniature imaging probe for an electron spin resonance imaging apparatus of claim 30, wherein said at least one gradient driver and coil minimizes power dissipation when operated in constant-gradient (CW-emulation) mode.

37. The miniature imaging probe for an electron spin resonance imaging apparatus of claim 36, wherein said at least one gradient coil consumes less than 1 Ampere when operated in constant-gradient (CW-emulation) mode.

38. The miniature imaging probe for an electron spin resonance imaging apparatus of claim 30, further comprising a shield material having electromagnetic shielding properties in the microwave regime, wherein the shield material provides electromagnetic transparency in the megahertz regime.

39. The miniature imaging probe for an electron spin resonance imaging apparatus of claim 30, wherein the miniature microwave resonator facilitates detection of an ESR signal.

40. The miniature imaging probe for an electron spin resonance imaging apparatus of claim 30 wherein the RF magnetic field is a microwave magnetic field.

* * * * *